(12) United States Patent
Yoshikawa et al.

(10) Patent No.: US 11,585,875 B2
(45) Date of Patent: Feb. 21, 2023

(54) MAGNETIC FIELD EVALUATION SYSTEM FOR VEHICLE AND MAGNETIC FIELD EVALUATION PROGRAM FOR VEHICLE

(71) Applicant: TOYOTA JIDOSHA KABUSHIKI KAISHA, Aichi-ken (JP)

(72) Inventors: Masayuki Yoshikawa, Toyota (JP); Hiroyuki Nishimura, Toyota (JP); Kazuhisa Ori, Toyota (JP); Kenichi Ichinose, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 17/666,416

(22) Filed: Feb. 7, 2022

(65) Prior Publication Data

US 2022/0268862 A1    Aug. 25, 2022

(30) Foreign Application Priority Data

Feb. 24, 2021   (JP) .............................. JP2021-027040

(51) Int. Cl.
*G01R 33/10*   (2006.01)

(52) U.S. Cl.
CPC .................................... *G01R 33/10* (2013.01)

(58) Field of Classification Search
CPC ............... G01R 33/00; G01R 33/0035; G01R 33/0023; G01R 33/0017; G01R 31/3191; G01R 33/063; G01R 33/0206; G01R 33/10; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 9,910,104 B2 * | 3/2018 | Boesch ................. | G01R 33/032 |
| 2001/0009975 A1 | 7/2001 | Tsukada et al. | |
| 2017/0343695 A1 * | 11/2017 | Stetson ................. | G01R 33/032 |
| 2020/0225041 A1 * | 7/2020 | Boka ...................... | G01C 17/28 |

FOREIGN PATENT DOCUMENTS

JP            H10248821 A        9/1998

* cited by examiner

*Primary Examiner* — Jermele M Hollington
*Assistant Examiner* — Taqi R Nasir
(74) *Attorney, Agent, or Firm* — Hauptman Ham, LLP

(57) ABSTRACT

A magnetic field measurement device measures a magnetic flux density vector or a magnetic field vector generated from each of segments obtained by segmenting a measurement target surface of a vehicle. A magnetic field evaluation device includes a propagation intensity calculation unit and a display control unit. The propagation intensity calculation unit calculates propagation intensity that is the intensity of a magnetic field or the magnitude of magnetic flux density that propagates from each of the segments to an evaluation point that is separated from the measurement target surface with use of the magnetic flux density vector or the magnetic field vector in each of the segments and a separation distance between the segments and the evaluation point. A display control unit displays on a display unit a propagation intensity distribution image indicating the position of the evaluation point and distribution of the propagation intensity in each of the segments.

4 Claims, 20 Drawing Sheets

FIG. 20
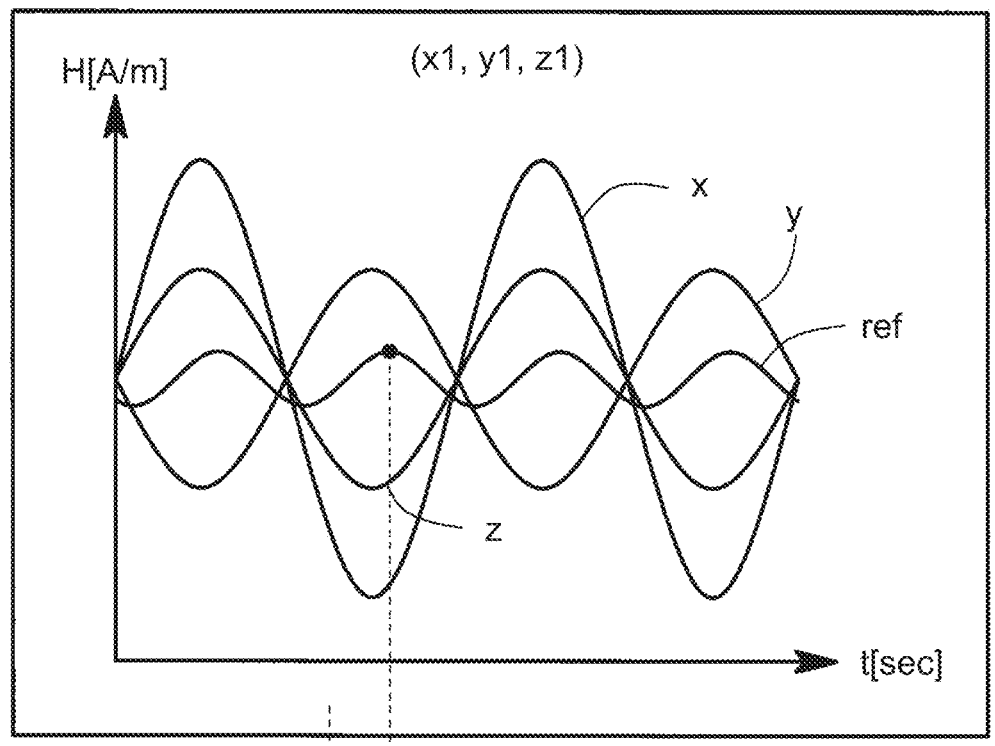
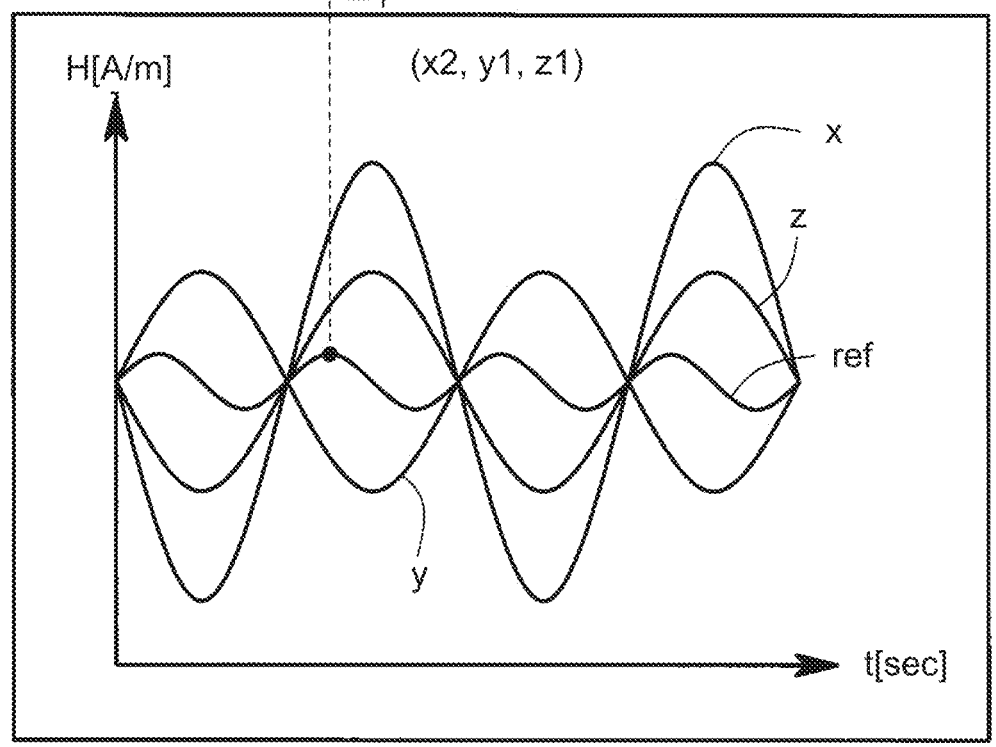

MAGNETIC FIELD EVALUATION SYSTEM FOR VEHICLE AND MAGNETIC FIELD EVALUATION PROGRAM FOR VEHICLE

CROSS-REFERENCE TO RELATED APPLICATION

This application claims priority to Japanese Patent Application No. 2021-027040 filed on Feb. 24, 2021, incorporated herein by reference in its entirety.

BACKGROUND

1. Technical Field

In this specification, a magnetic field evaluation system for a vehicle and a magnetic field evaluation program for a vehicle are disclosed.

2. Description of Related Art

Hybrid vehicles, electric vehicles, fuel cell vehicles, etc., which are equipped with electric devices as vehicle driving mechanisms such as inverters and rotary electric machines, generate alternating magnetic fields (also known as AC magnetic fields) due to driving of the electric devices. In order to measure the generated alternating magnetic fields, in Japanese Unexamined Patent Application Publication No. 10-248821, for example, magnetic field intensity is measured at a plurality of points on a surface with a plurality of magnetic flux meters. Based on the result of measurements, values of the magnetic field intensity on the surface are further connected by an isointensity curve and displayed as a contour map.

SUMMARY

Incidentally, when a magnetic field propagates to a certain evaluation point (e.g., a leg part of a seat in a vehicle cabin), shielding measures are taken to reduce the magnetic field that propagates to the evaluation point, such as attaching a shield material made of a ferromagnetic substance or applying a shield paint containing the ferromagnetic substance to the source of magnetic field propagation that is distanced from the evaluation point. Here, when magnetic fields propagate to the evaluation point from a plurality of locations, it is not always rational to apply shielding measures to all the sources of propagation.

Therefore, in order to make it possible to efficiently select (narrow down) the locations where the shielding measures are applied, this specification discloses a magnetic field evaluation system for a vehicle and a magnetic field evaluation program for a vehicle, capable of identifying sources of magnetic field propagation to an evaluation point, and further capable of identifying the intensity of the magnetic fields propagating from the respective propagation sources to the evaluation point.

A vehicle magnetic field evaluation system for a vehicle disclosed in this specification includes a magnetic field measurement device and a magnetic field evaluation device connected thereto. The magnetic field measurement device is configured to measure a magnetic flux density vector or a magnetic field vector generated from each of a plurality of segments obtained by segmenting a measurement target surface that is any plane surface of a vehicle. The magnetic field evaluation device includes a propagation intensity calculation unit and a display control unit. The propagation intensity calculation unit is configured to calculate propagation intensity that is the intensity of a magnetic field or the magnitude of magnetic flux density that propagates from each of the segments to an evaluation point that is separated from the measurement target surface with use of the magnetic flux density vector or the magnetic field vector of each of the segments and a separation distance between the segments and the evaluation point. The display control unit is configured to display on a display unit a propagation intensity distribution image indicating the position of the evaluation point and distribution of the propagation intensity in each of the segments.

With the configuration, it becomes possible to identify the source of the magnetic field propagation to the evaluation point or the source of propagation of the magnetic flux density obtained by multiplying the magnetic field by magnetic permeability for each segment, and the intensity of propagation to the evaluation point in each segment is displayed.

In the configuration, the magnetic field measurement device may measure the magnetic flux density vector or the magnetic field vector in each of the segments with a time lag. In this case, the magnetic field evaluation device for a vehicle is connected to a reference signal output device. The reference signal output device outputs a reference signal of a fixed frequency during a measurement period of the magnetic flux density vector or the magnetic field vector by the magnetic field measurement device. The magnetic field evaluation device further includes a data processing unit. The data processing unit calculates phase difference between the magnetic flux density vectors or the magnetic field vectors of different segments among the segments based on the reference signal.

With the configuration, it becomes possible to match the phases of the magnetic flux density vectors or the magnetic field vectors measured with a time lag, i.e., with a phase difference, based on the reference signal.

In the configuration, the measurement target surface may be a vehicle cabin panel surrounding a vehicle cabin. In this case, the evaluation point is set in a portion of the vehicle cabin that is separated from the vehicle cabin panel.

With the configuration, it becomes possible to evaluate the influence of the magnetic field generated from the vehicle cabin panel to the evaluation point (for example, any point on the seat) in the vehicle cabin.

A magnetic field evaluation program for a vehicle disclosed in this specification causes a computer, used in unison with the magnetic field measurement device, to function as a propagation intensity calculation unit and a display control unit. The magnetic field measurement device is configured to measure a magnetic flux density vector or a magnetic field vector generated from each of a plurality of segments obtained by segmenting a measurement target surface that is any plane surface of a vehicle. The propagation intensity calculation unit is configured to calculate propagation intensity that is the intensity of a magnetic field or the magnitude of magnetic flux density that propagates from each of the segments to an evaluation point that is separated from the measurement target surface with use of the magnetic flux density vector or the magnetic field vector of each of the segments and a separation distance between the segments and the evaluation point. The display control unit is configured to display on a display unit a propagation intensity distribution image indicating the position of the evaluation point and distribution of the propagation intensity in each of the segments.

The magnetic field evaluation system for a vehicle and the magnetic field evaluation program for vehicle disclosed in this specification can identify sources of magnetic field propagation to an evaluation point, and can further identify the intensity of the magnetic field propagation from the propagation sources to the evaluation point.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 20 is a graph illustrating an x-component, a y-component, and a z-component of a magnetic field measured by the magnetic field measurement device, and a reference signal.

DETAILED DESCRIPTION OF EMBODIMENTS

The embodiment of the present disclosure will be described below with reference to the drawings. Shapes, materials, the number, and values described below are merely exemplary, and modifications are possible as appropriate according to the specifications of the magnetic field evaluation system for a vehicle. In all the drawings shown below, like components are designated by like reference signs.

Vehicle Subject to Magnetic Field Evaluation

Figure 1:
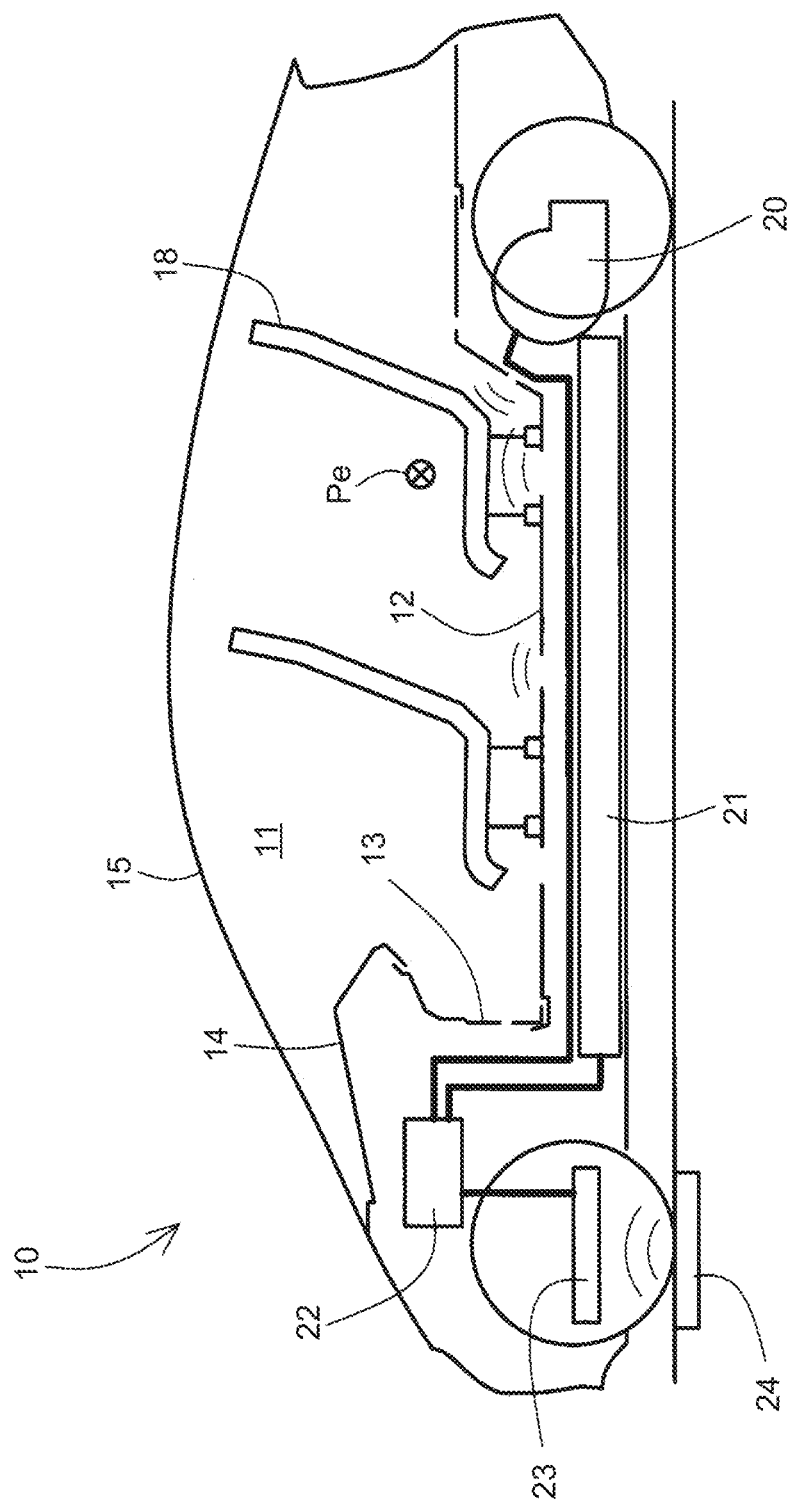
FIG. 1 is a schematic view illustrating a vehicle subject to magnetic field evaluation by a magnetic field evaluation system for a vehicle according to the present embodiment.

FIG. 1 illustrates a side view of a vehicle 10 subject to magnetic field evaluation by a magnetic field evaluation system for a vehicle according to the present embodiment. The vehicle 10 shown in FIG. 1 is a hybrid vehicle including a rotary electric machine 20 as a drive source. As another example, the vehicle 10 may be one of an electric vehicle and a fuel cell vehicle including the rotary electric machine 20 as a drive source.

The vehicle 10 includes the rotary electric machine 20, a battery 21 as an electric power source, and an inverter 22 that converts direct current electric power of the battery 21 into alternating current electric power. The vehicle 10 shown in FIG. 1 also supports so-called contactless charging. The vehicle 10 includes a charger 23 that receives electric power from power feeders 24 on the road. All of the in-vehicle electric devices, except for the power feeders 24 on the road, are provided in a lower part of the vehicle, for example.

When the electric devices are driven, the electric devices generate alternating magnetic fields. Magnetic shields, made of ferromagnetic materials or the like, are provided around the electric devices, so that leakage of most of the alternating magnetic fields is prevented. However, a small part of the alternating magnetic fields propagates to the inside of a vehicle cabin 11. For example, a magnetic field of a low frequency of 10 kHz or less propagates into the vehicle cabin 11.

As will be described later, the magnetic field evaluation system in the present embodiment uses any plane surface of a vehicle as a measurement target surface, and measures a magnetic field or magnetic flux density on the measurement target surface. The measurement target surface may be a vehicle cabin panel that is a panel member surrounding the vehicle cabin 11, for example.

Figure 2:
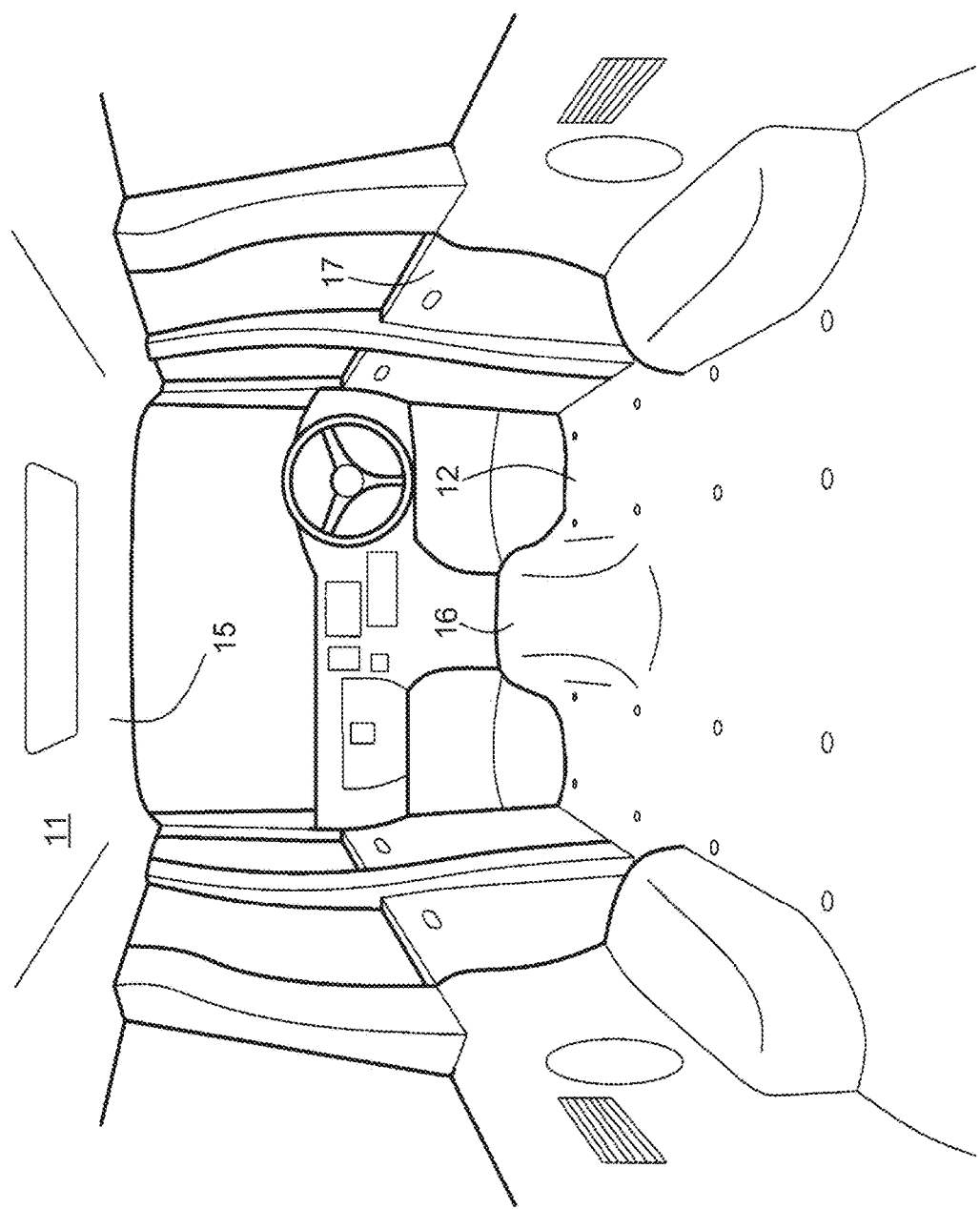
FIG. 2 is a perspective view illustrating the inside of a vehicle cabin at the time of measuring a magnetic field.

Referring to FIGS. 1 and 2, the vehicle cabin panel includes a floor panel 12, a dash panel 13, a cowl panel 14, a roof panel 15, a floor tunnel 16, and door panels 17. Hereinafter, for easy illustration and description, an example in which the measurement target surface is the floor panel 12 is presented.

Here, when the floor panel 12 is used as a surface subject to magnetic field measurement, seats in the vehicle cabin may be removed to facilitate measurement. Seat rails or other fastening members used to engage the seats to skeletal members, such as floor panels and floor cloths, as well as decorative parts such as floor carpets, may also be removed. For example, when measuring the magnetic field on the floor panel 12 that is the measurement target surface, the floor panel 12 is in the state of being exposed in the vehicle cabin.

Magnetic Field Measurement System

Figure 3:
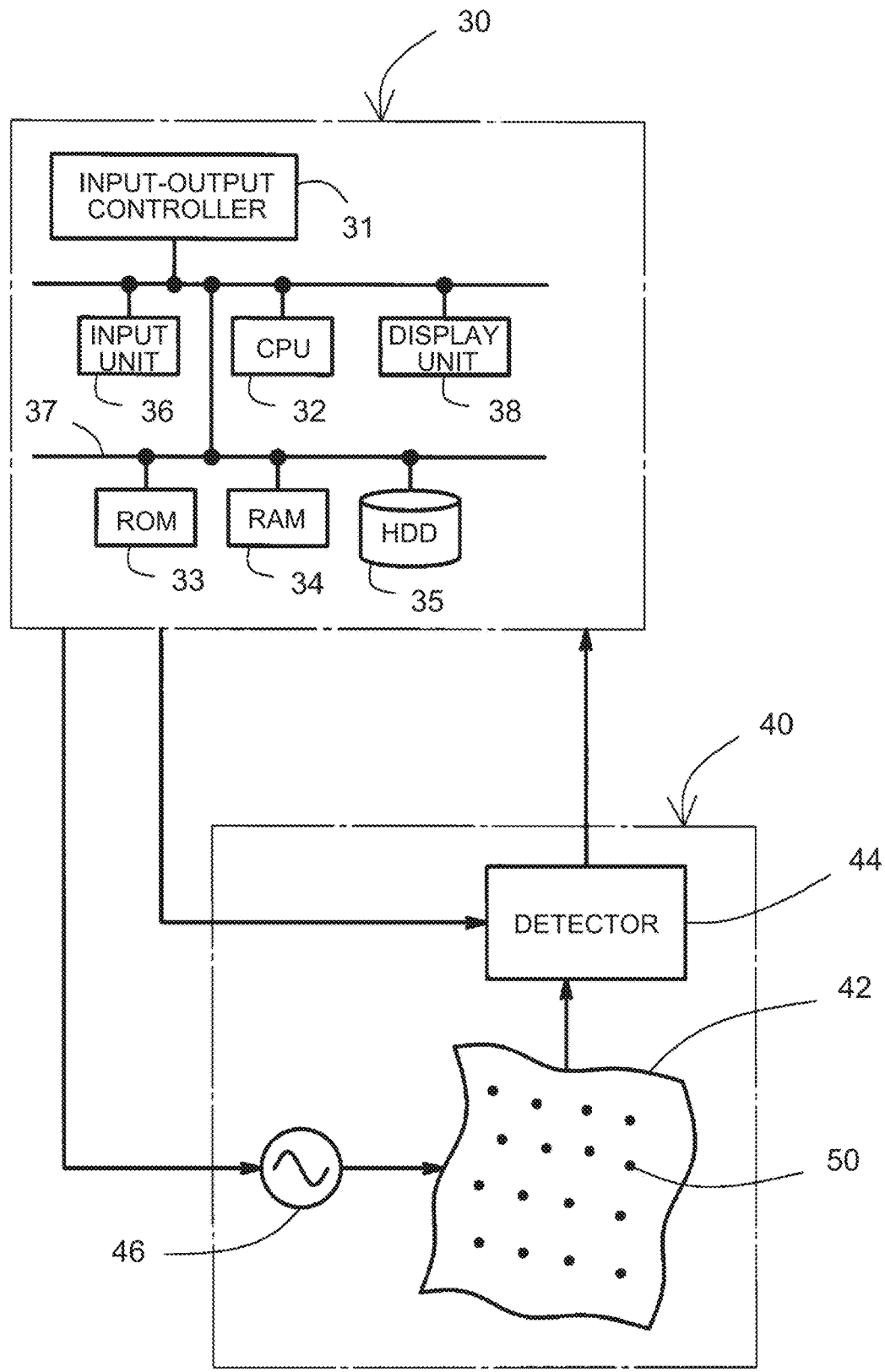
FIG. 3 illustrates hardware configuration of the magnetic field evaluation system for a vehicle according to the present embodiment.

FIG. 3 illustrates hardware configuration of the magnetic field evaluation system according to the present embodiment. The magnetic field measurement system includes a magnetic field evaluation device 30 and a magnetic field measurement device 40.

Magnetic Field Measurement Device

The magnetic field measurement device 40 measures a magnetic field that is generated from the measurement target surface (e.g., floor panel 12). For example, the magnetic field measurement device 40 includes a sensor sheet 42, a detector 44, and an alternating current power source 46.

The sensor sheet 42 has a plurality of sensor elements 50 disposed at equal intervals on a cloth seat. For example, the sensor elements 50 are disposed on a flat surface sheet at equal intervals in a length direction and in a width direction orthogonal to the length direction such that the sensor elements 50 are distributed evenly in two dimensions.

Figure 4:
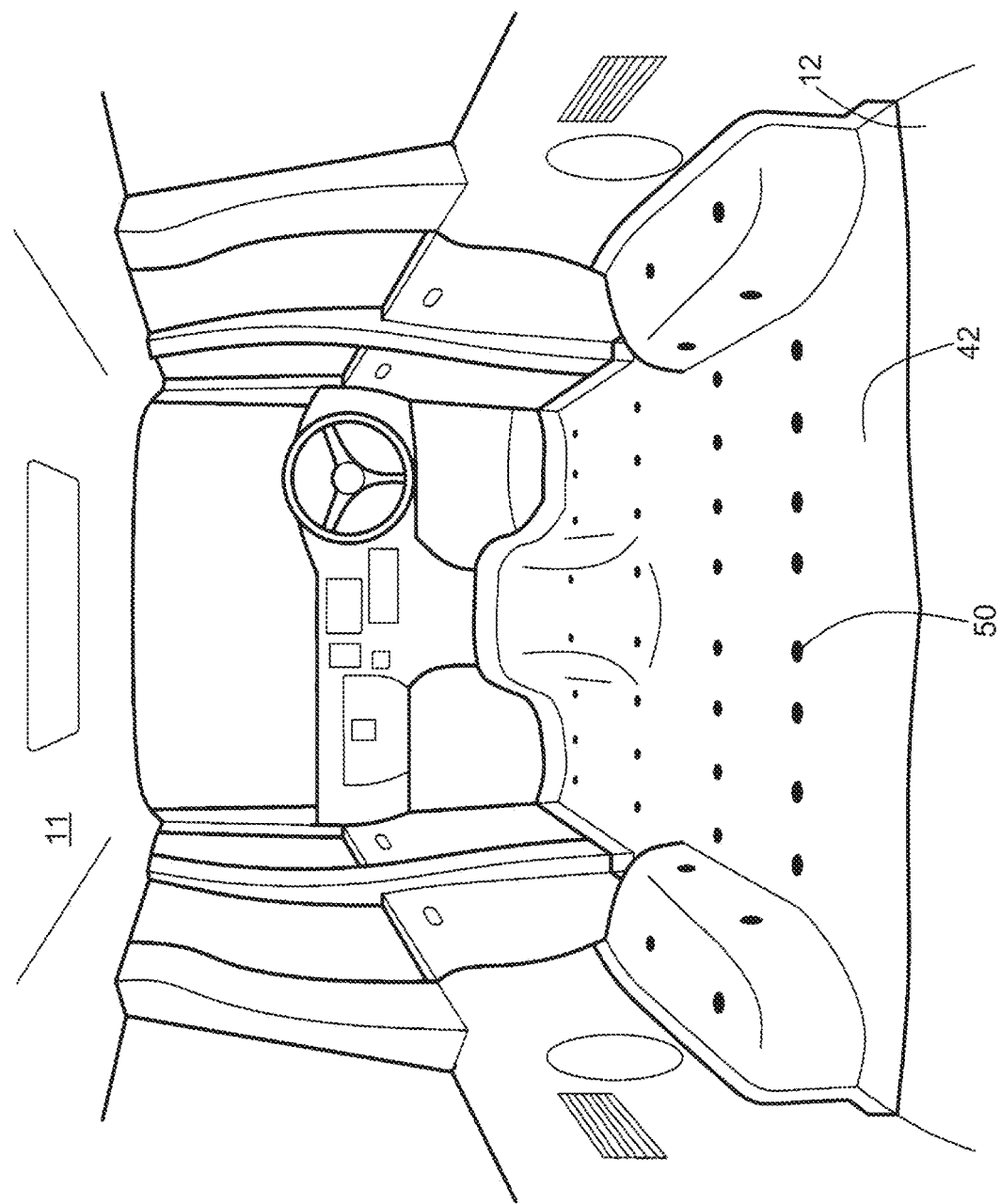
FIG. 4 is a perspective view illustrating an example of a sensor sheet spread on the floor in the vehicle cabin.

The sensor sheet 42 covers the measurement target surface. The sensor sheet 42 is laid on the floor panel 12 as shown in FIG. 4, for example. The sensor sheet 42 is made of a flexible seat material, which is laid so as to follow the surface shape of the floor panel 12. By laying the sensor sheet 42 on the floor panel 12 that is the measurement target surface, it becomes possible to measure a generated magnetic field at a plurality of points on the floor panel 12.

The positions of the sensor elements 50 on the floor panel 12 are stored in a vehicle cabin three-dimensional data storage unit 61D (see FIG. 7) as will be described later. For example, the three-dimensional coordinates of each of the sensor elements 50 are stored in the vehicle cabin three-dimensional data storage unit 61D. The vehicle cabin three-dimensional data storage unit 61D also stores three-dimensional data on vehicle cabin structure (for example, three-dimensional CAD data), and stores the position coordinates of each of the sensor elements 50 in association with the three-dimensional data on the vehicle cabin structure. For example, which location on the floor panel 12 a prescribed sensor element 50 is disposed is stored in the vehicle cabin three-dimensional data storage unit 61D.

Figure 9:
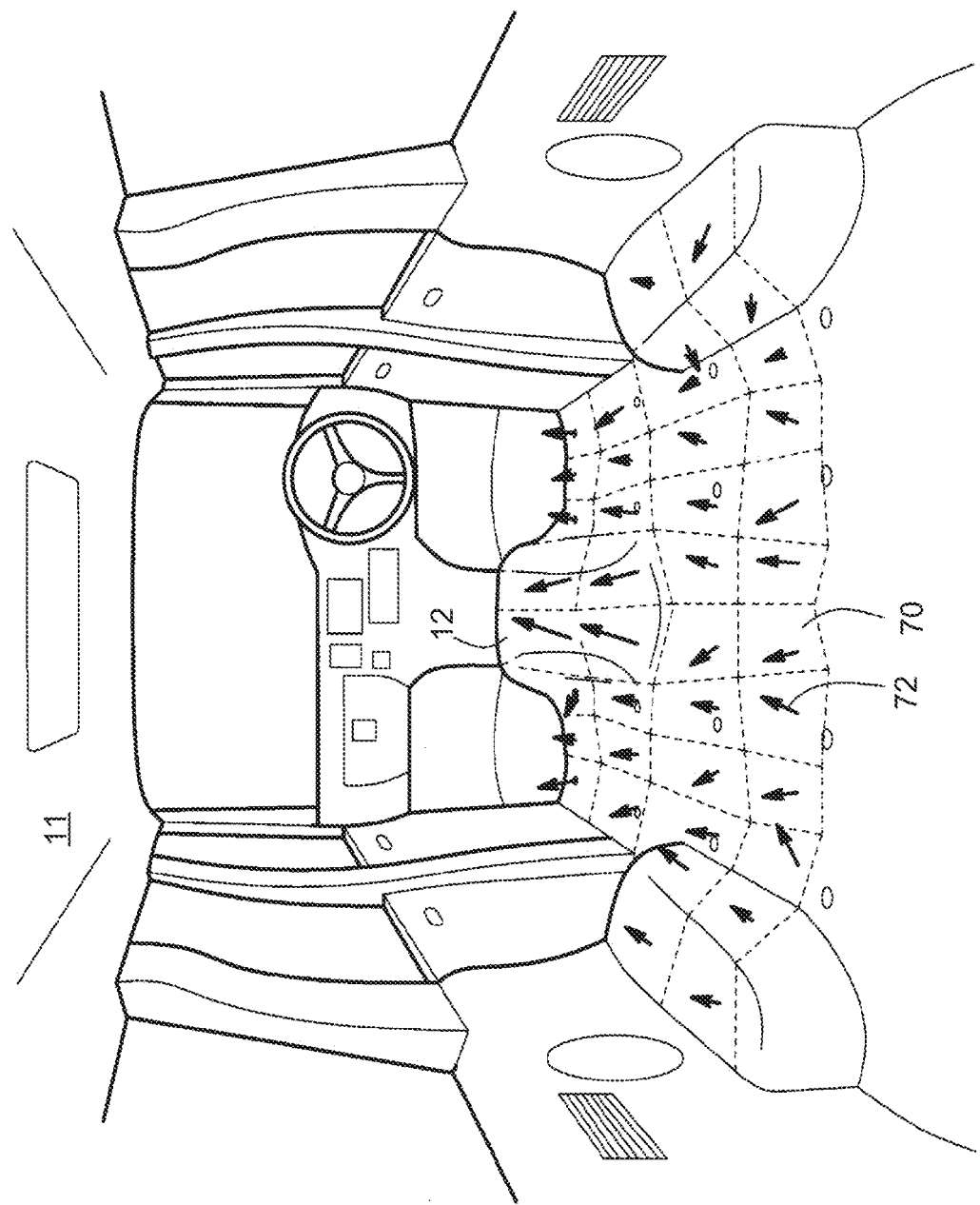
FIG. 9 illustrates a generated magnetic field and magnetic flux density distribution image.

For example, coordinate points on the measurement target surface where the sensor elements 50 are disposed are handled as sampling points. As shown in FIG. 9 described later, the measurement target surface is further divided into a plurality of segments 70 with the sampling points as center points. When the area of the segments 70 is sufficiently small, the magnetic field (magnetic flux density) inside the segments 70 is considered to be uniform. For this reason, it can be considered that a magnetic field vector or a magnetic flux density vector measured by each of the sensor elements 50 refers to a magnetic field vector or a magnetic flux density vector generated from each of the segments 70.

Figure 5:
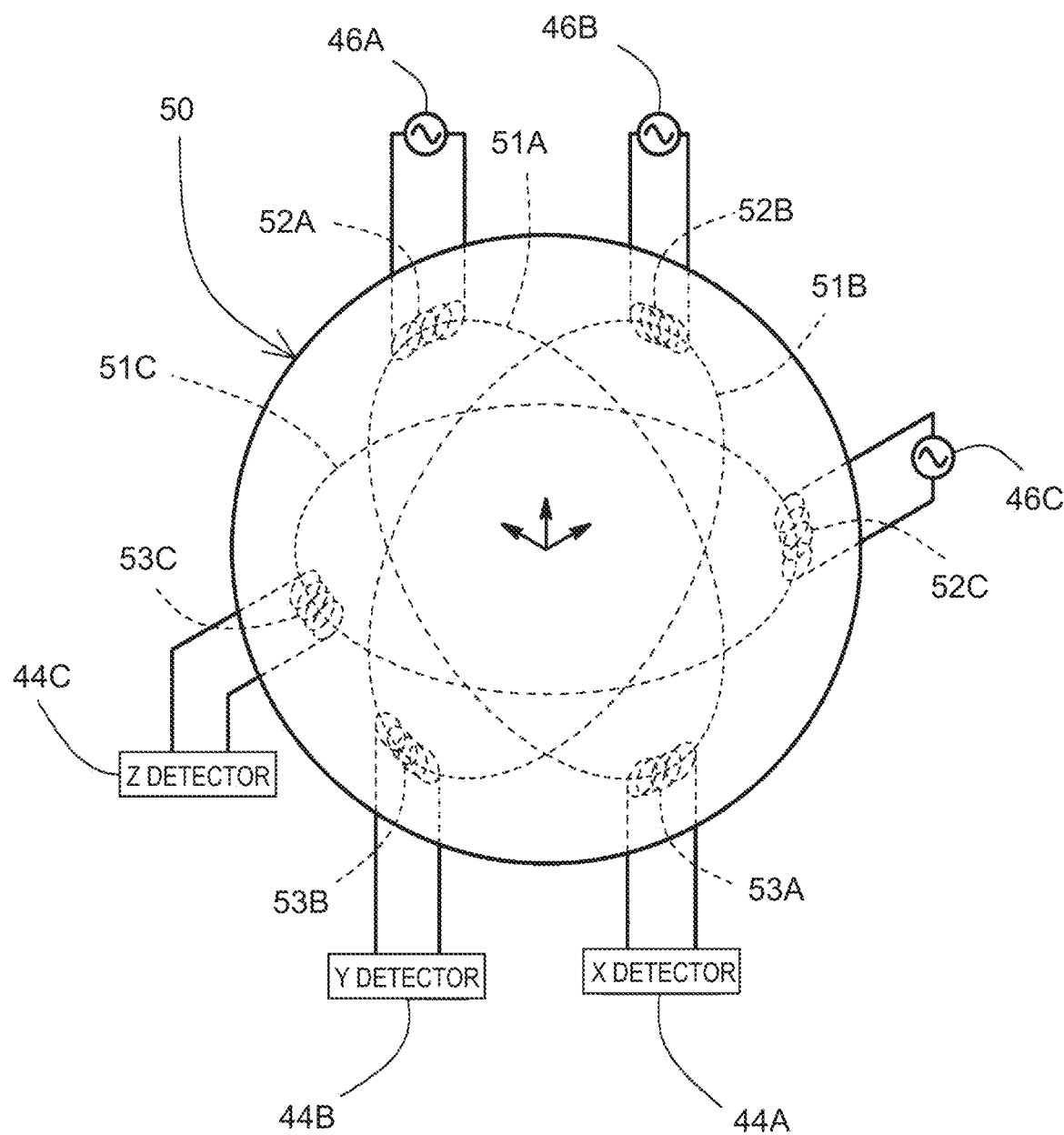
FIG. 5 illustrates a magnetic field measurement device.

FIG. 5 illustrates the detector 44, the alternating current power source 46, and the sensor element 50 in the magnetic field measurement device 40. The sensor element 50, for example, may be a triaxial flux gate-type magnetic field sensor. In other words, the sensor element 50 can measure magnetic fields in three orthogonal axes (X-axis, Y-axis, and Z-axis).

For example, as a mechanism for measuring a magnetic field in the X-axis direction, the sensor element 50 includes an X-core 51A, an X-excitation coil 52A, and an X-detection coil 53A. The X-excitation coil 52A is connected to an X-alternating current power source 46A, and the X-detection coil 53A is connected to an X-detector 44A.

The X-core 51A, for example, is in a circular loop shape and made of a material with high permeability. The X-excitation coil 52A is wound around a part of the X-core 51A, and the X-detection coil 53A is also wound around another part of the X-core 51A. The X-excitation coil 52A and the X-detection coil 53A may be wound reversely from each other.

Since the measurement principle of the flux gate-type magnetic field sensor is known, the measurement principle is briefly described here. When alternating current is fed from the X-alternating current power source 46A to the X-excitation coil 52A, a magnetic flux is generated in the X-core 51A. With a change in magnetic flux, an inductive voltage is generated in the X-detection coil 53A. The waveform of the inductive voltage varies depending on the presence or absence of a magnetic flux that interlinks the X-core 51A, and a distortion degree of an inductive voltage waveform also varies depending on the intensity of the magnetic flux.

Therefore, when the inductive voltage generated in the X-detection coil 53A is detected by a detector (for example, a voltage sensor), the magnetic flux interlinking the X-detection coil 53A, i.e., the intensity of the magnetic field in the X-axis direction, can be measured based on the waveform of the inductive voltage.

By multiplying a magnetic field H by permeability magnetic flux density B is obtained ($B=\mu H$). The permeability $\mu$ is known from physical properties or the like of the floor panel 12 that is the measurement target surface. Accordingly, when the magnetic field H is obtained, the magnetic flux density B is also obtained.

In addition to the mechanism for measuring the intensity of the magnetic field (or the magnitude of the magnetic flux density) in the X-axis direction, a mechanism for measuring the intensity of the magnetic field (or the magnitude of the magnetic flux density) in the Y-axis direction is also included in the sensor element 50. As the mechanism, the sensor element 50 includes a Y-detector 44B, a Y-alternating current power source 46B, a Y-core 51B, a Y-excitation coil 52B, and a Y-detection coil 53B.

Similarly, as a mechanism for measuring the intensity of the magnetic field (or the magnitude of the magnetic flux density) in a Z-axis direction, the sensor element 50 includes a Z-detector 44C, a Z-alternating current power source 46C, a Z-core 51C, a Z-excitation coil 52C, and a Z-detection coil 53C. The center axes of the X-core 51A, the Y-core 51B, and the Z-core 51C are orthogonal to each other.

Figure 6:
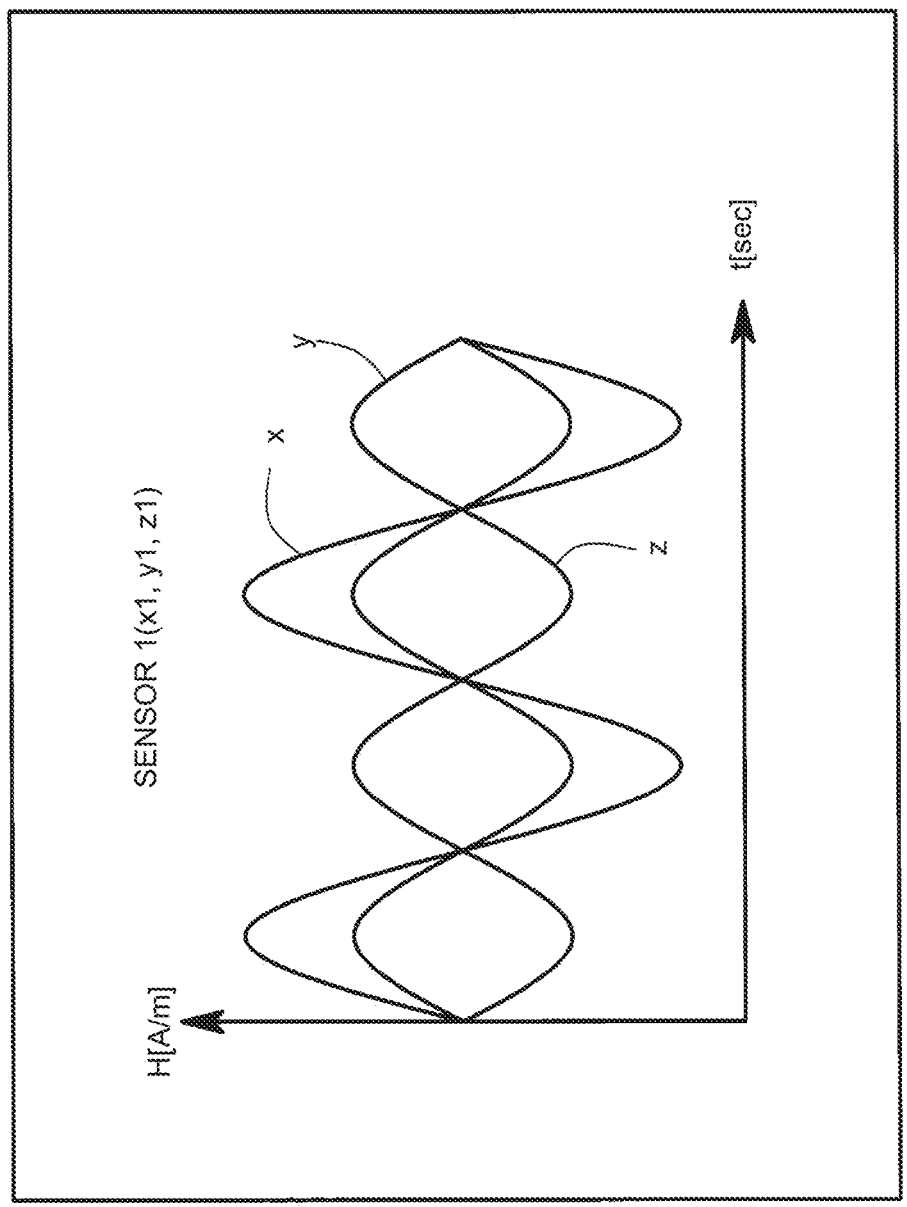
FIG. 6 is a graph illustrating an x-component, a y-component, and a z-component of a magnetic field measured by the magnetic field measurement device.

FIG. 6 illustrates a triaxial magnetic field data graph showing time change of the magnetic field H [A/m] measured by the magnetic field measurement device 40. Magnetic fields H, based on the inductive voltages detected by the X-detector 44A, the Y-detector 44B, and the Z-detector 44C, are independently acquired, and an X-component Hx, a Y-component Hy, and a Z-component Hz of the acquired magnetic fields are plotted in the graph. As will be described later, the X-component Hx, the Y-component Hy, and the Z-component Hz of the magnetic fields are combined to obtain a magnetic field vector H.

As described above, the magnetic field measurement device 40 can obtain a magnetic flux density vector B by using the permeability $\mu$. In other words, the graph of FIG. 6 can also be changed to a triaxial magnetic flux density data graph showing time change of an X-component Bx, a Y-component By, and a Z-component Bz with the magnetic flux density [T] as a vertical axis.

Magnetic Field Evaluation Device

Referring to FIG. 3, the magnetic field evaluation device 30 is connected with the magnetic field measurement device 40 so as to be communicable with each other. For example, the magnetic field measurement device 40 is disposed inside the vehicle cabin 11, and the magnetic field evaluation device 30 is disposed at a location separated from the vehicle cabin 11.

The magnetic field evaluation device 30 is constituted of a computer (electronic calculator), for example. The magnetic field evaluation device 30 has hardware configuration including an input-output controller 31, a CPU 32, a ROM 33, a RAM 34, a hard disk drive (HDD) 35, an input unit 36, and a display unit 38, which are connected to an internal bus 37.

The input unit 36 may be an input device such as a keyboard, mouse, etc. As will be described later, the input unit 36 includes selecting means that can select an image to be displayed on the display unit 38, out of an intensity component graph image (see FIG. 6), a generated magnetic field and magnetic flux density distribution image (see FIG. 9), and a propagation intensity distribution image (see FIG. 11). Here, the display unit 38 may be a display device, for example.

For example, a button image for selecting one of the three images is displayed on the display unit 38. Furthermore, an operator operates the input unit 36 (for example, a mouse) to move a pointer on the screen of the display unit 38, and performs click operation on the button image. At the time, out of the three images, the image desired by the operator is displayed on the display unit 38 through the display control unit 64 (see FIG. 7). As will be described later, the input unit 36 can be used to select a plurality of segments 70 in order to obtain a contribution degree of the intensity of a magnetic field propagating to an evaluation point Pe while the propagation intensity distribution image (see FIG. 11) is displayed.

Back to FIG. 3, the CPU 32 executes a later-described program for magnetic field evaluation to execute arithmetic processes in various function blocks shown in FIG. 7. The ROM 33 or the hard disk drive 35 serving as a storage device may store the program for magnetic field evaluation. The storage devices also constitute a triaxial correction data storage unit 61C and the vehicle cabin three-dimensional data storage unit 61D shown in FIG. 7.

Figure 7:
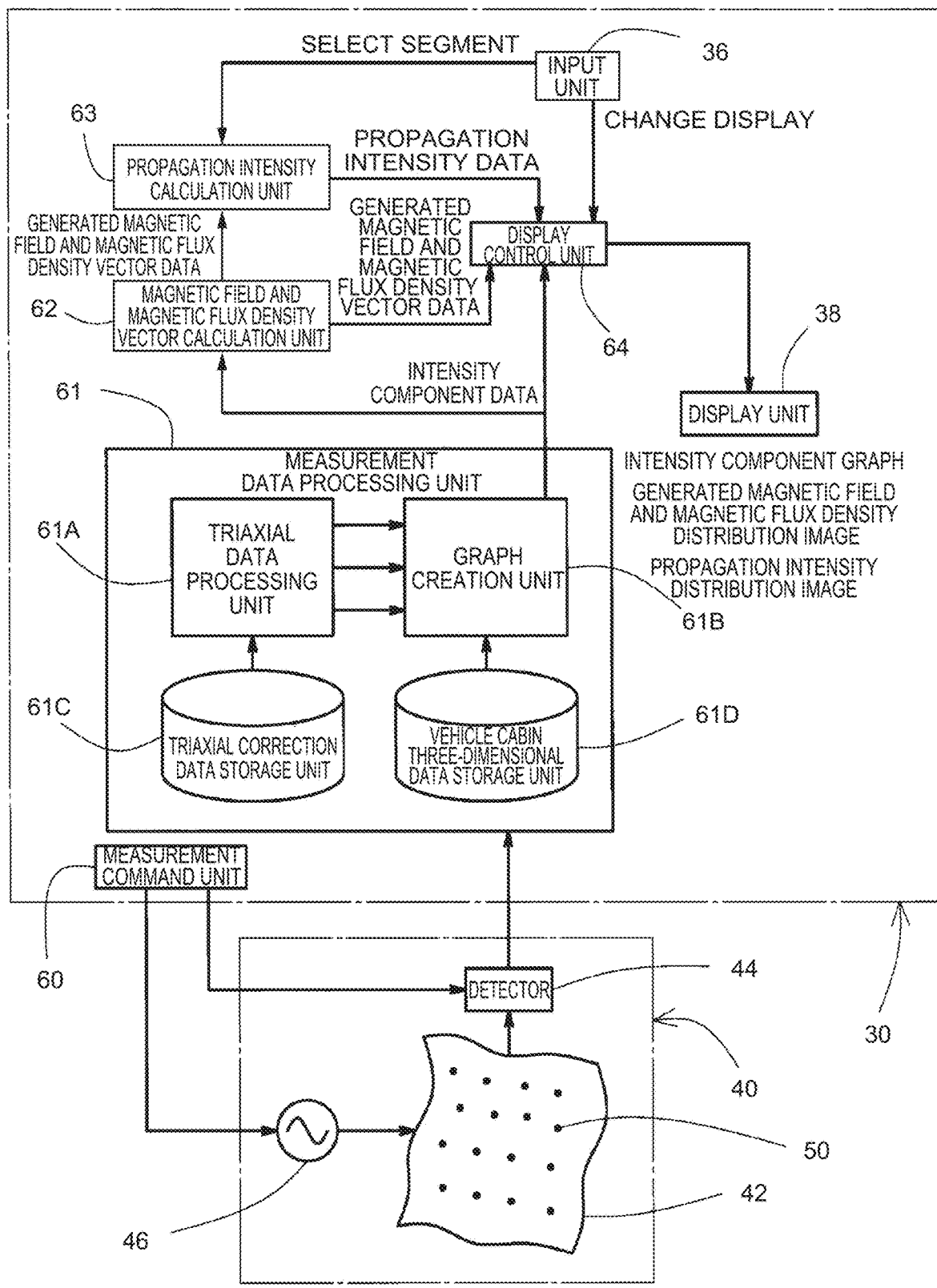
FIG. 7 illustrates functional blocks of the magnetic field evaluation system for a vehicle according to the present embodiment.

When the CPU 32 executes the magnetic field evaluation program stored in the ROM 33 or the hard disk drive 35, functional blocks as illustrated n in FIG. 7 are configured in the magnetic field evaluation device 30. Specifically, the magnetic field evaluation device 30 includes a measurement command unit 60, a measurement data processing unit 61, a magnetic field and magnetic flux density vector calculation unit 62, a propagation intensity calculation unit 63, and a display control unit 64.

In the example shown in FIG. 7, three arithmetic processing units, including the measurement data processing unit 61, the magnetic field and magnetic flux density vector calculation unit 62, and the propagation intensity calculation unit 63, are illustrated. However, the arithmetic processing units may be combined and regarded as an integrated calculation unit. The functional blocks can also be configured by the CPU 32 executing the magnetic field evaluation program stored in a non-transitory computer-readable storage medium such as a DVD.

The measurement command unit 60 can output a measurement command for the magnetic field measurement device 40 to measure the magnetic field generated on the measurement target surface (floor panel 12, for example) or magnetic flux density. For example, in response to the input operation of a measurement command via the input unit 36, the measurement command unit 60 outputs the measurement command to the magnetic field measurement device 40.

The measurement data processing unit 61 receives magnetic field intensity data or magnetic flux density data for each of the three axes (X-axis, Y-axis, and Z-axis) measured by the magnetic field measurement device 40. The measurement data processing unit 61 processes the transmitted magnetic field intensity data or the magnetic flux density data for each of the three axes, and transmits to the display control unit 64 time change graph data on the magnetic field or magnetic flux density for each of the three axes as shown in FIG. 6.

The measurement data processing unit 61 includes a triaxial data processing unit 61A, a graph creation unit 61B, the triaxial correction data storage unit 61C, and the vehicle cabin three-dimensional data storage unit 61D. The triaxial correction data storage unit 61C stores the position correction data for each sensor element 50 on the sensor sheet 42 (see FIG. 4).

As illustrated in FIG. 4, the sensor sheet 42 is laid unevenly to follow the surface shape of the floor panel 12 that is the measurement target surface. Accordingly, the directions of the sensor elements 50 provided on the sensor sheet 42 are different from each other. The sensor elements 50 can measure the magnetic field or the flux density in each of the three orthogonal axes. However, since the sensor elements 50 orient in different directions, detection axes of the respective sensor elements 50 may not be matched (orient in different directions).

Accordingly, the triaxial correction data storage unit 61C stores the amount of deviation of three axes, which are detection axes of the respective sensor elements 50, with respect to orthogonal three axes in a prescribed reference space coordinate system. As the reference space coordinate system, a space coordinate system used to construct the vehicle cabin three-dimensional shape data (for example, 3D-CAD data) is used.

Figure 8:
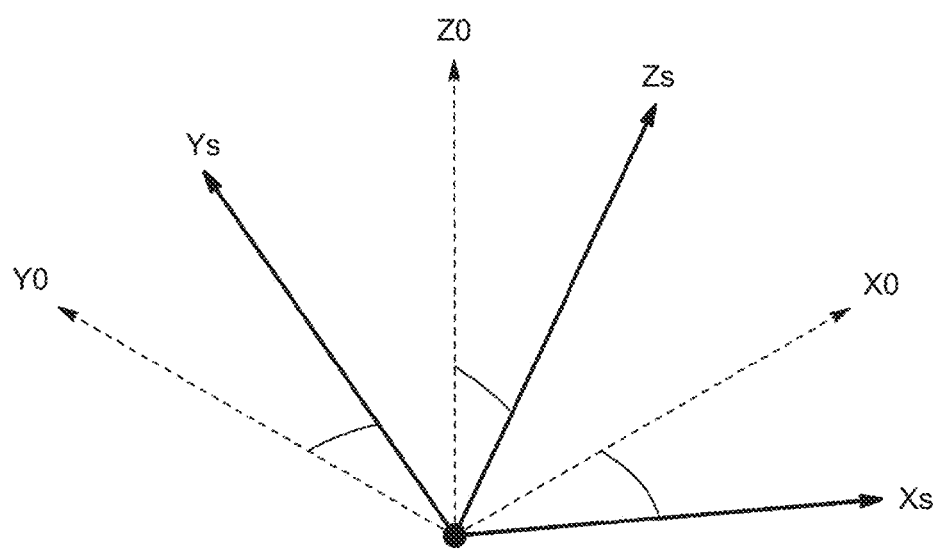
FIG. 8 shows deviation between an x-axis, a y-axis, and a z-axis in the magnetic field measurement device and an x-axis, a y-axis, and a z-axis in a reference space.

For example, when the three-dimensional data on the inside of the vehicle cabin 11 is constructed, reference space coordinates including orthogonal three axes (X0,Y0,Z0) as illustrated in FIG. 8 are configured with a prescribed reference point as an origin. The triaxial correction data storage unit 61C stores the amount of deviation of orthogonal three axes (Xs,Ys,Zs), which are detection axes of the respective sensor elements 50 on the sensor sheet 42 (see FIG. 4), with respect to the three axes (X0,Y0,Z0) in the reference space coordinate system.

First, the triaxial data processing unit 61A acquires, from the magnetic field measurement device 40, X-component data, Y-component data, and Z component data on the magnetic field vector or the magnetic flux density vector measured by each of the sensor elements 50. Then, the triaxial data processing unit 61A converts the three component data to orthogonal triaxial component data in the reference spatial coordinate system, based on the amount of deviation stored in the triaxial correction data storage unit 61C.

The converted triaxial component data is sent to the graph creation unit 61B. The graph creation unit 61B refers to the vehicle cabin three-dimensional data storage unit 61D to acquire sensor position information indicating which sensor element 50 is arranged at which position on the floor panel 12 that is the measurement target surface. The sensor position information is also referred to as sampling point coordinates. The graph creation unit 61B further transmits to the display control unit 64 the magnetic field or magnetic flux density triaxial component data (on the reference space coordinate system) in association with the sampling point coordinates.

The display control unit 64 displays on the display unit 38 the intensity component graph of the magnetic field or magnetic flux density as shown in FIG. 6, when the triaxial component data is acquired from the graph creation unit 61B and an operation to request display of the intensity component graph is made from the input unit 36.

For example, the intensity component graph displays sensor IDs given to the individual sensor elements 50 (for example, "sensor 1") and three-dimensional coordinates (x1,y1,z1) of the sampling points where the sensor elements 50 are placed. In addition to these, the time change of the magnetic field intensity or the magnitude of the magnetic flux density is displayed for each of the orthogonal three axes (X-component, Y-component, and Z-component).

Generated Magnetic Field and Magnetic Flux Density Distribution Image

The magnetic field and magnetic flux density vector calculation unit 62 calculates a magnetic field vector or a magnetic flux density vector at each sampling point by using the points where the sensor elements 50 measure the magnetic field or the magnetic flux density as the sampling points. Furthermore, the magnetic field and magnetic flux density vector calculation unit 62 transmits to the display control unit 64 the generated magnetic field and magnetic flux density vector data calculated for each of the sampling points, i.e., for each of the segments 70 (see FIG. 9) around the sampling points.

Figure 10:
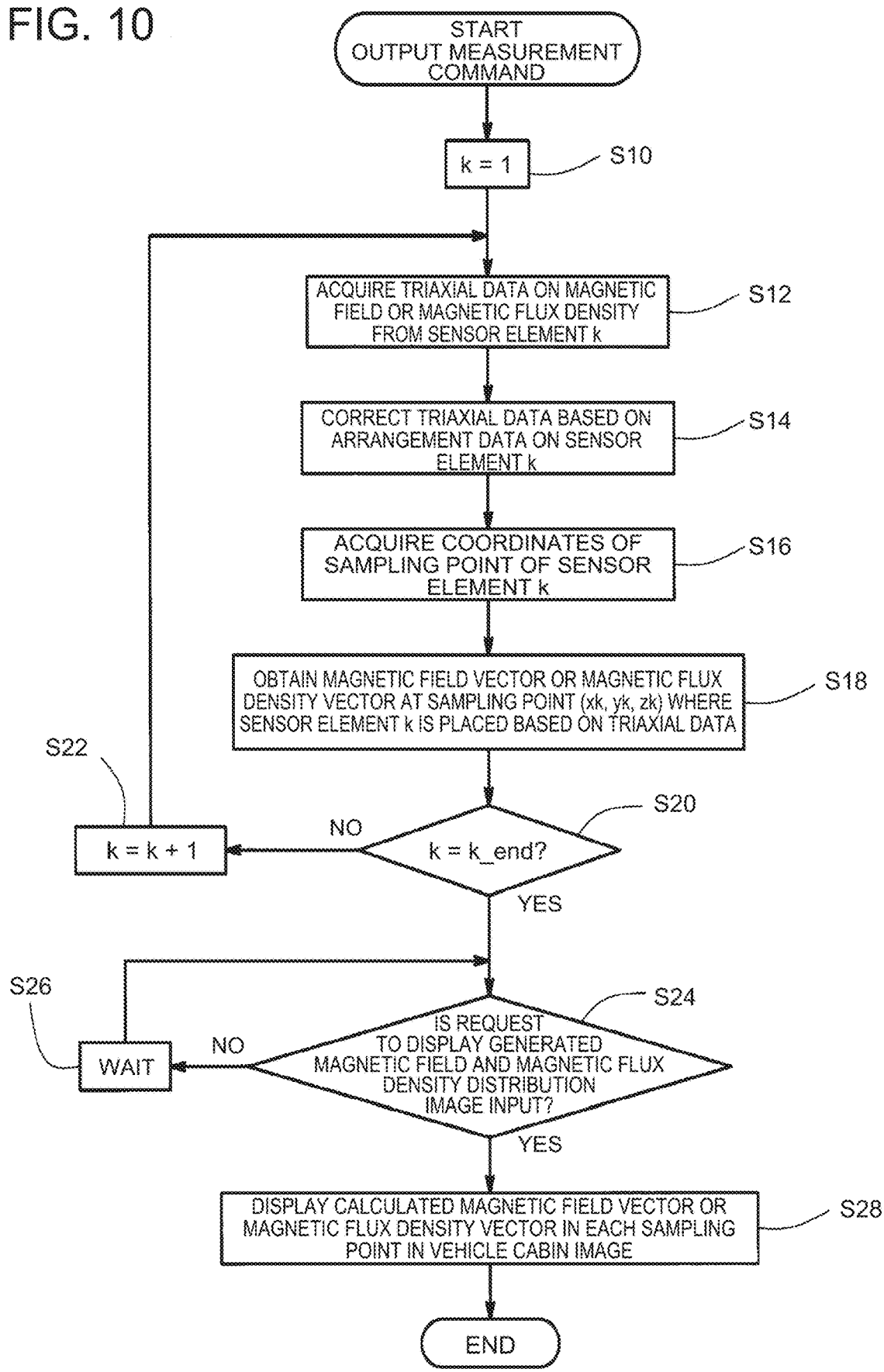
FIG. 10 illustrates a display flow of the generated magnetic field and magnetic flux density distribution image.

FIG. 10 shows a flow from the magnetic field measurement device 40 to the display of the generated magnetic field and magnetic flux density distribution image illustrated in FIG. 9. The flow is partially identical to the flow to create the intensity component graph in FIG. 6.

The measurement command unit 60 outputs a measurement command to the magnetic field measurement device 40 with a measurement command operation input in the input unit 36 as a trigger. The triaxial data processing unit 61A of the measurement data processing unit 61 sets a count k of the sensor element 50 of the magnetic field measurement device 40 to an initial value "1" (S10). The triaxial data processing unit 61A acquires triaxial component data on the magnetic field vector or magnetic flux density vector from the first (k-th count) sensor element 50 (S12).

Next, the triaxial data processing unit 61A acquires, from the triaxial correction data storage unit 61C, correction data for the sensor element 50 of the k-th count, that is, data on the amount of deviation of the orthogonal three axes, which are measurement axes of the sensor element 50, with respect to orthogonal three axes in the reference space coordinate system. The triaxial data processing unit 61A further converts the triaxial component data of the sensor element 50 to triaxial component data in the reference space coordinate system, based on the correction data (S14)

Next, the graph creation unit 61B acquires, from the vehicle cabin three-dimensional data storage unit 61D, the position coordinate data (sampling point coordinate data) about the sensor element 50 of the k-th count on the floor panel 12 which is the measurement target surface (S16).

The corrected triaxial component data and sensor position coordinate data are sent to the display control unit 64 as data for graph creation, as well as to the magnetic field and magnetic flux density vector calculation unit 62. Based on the triaxial component data, the magnetic field and magnetic flux density vector calculation unit 62 obtains a magnetic field vector or a magnetic flux density vector at a sampling point (xk,yk,zk) which is the position where the sensor element 50 of the k-th count is placed (S18). The obtained magnetic field vector or flux density vector is appropriately subjected to arithmetic processing as a magnetic field vector or a magnetic flux density vector of the segment 70 (see FIG. 9) around the sampling point (xk,yk,zk).

The magnetic field vectors or the magnetic flux density vectors essentially indicate vectors composed of triaxial component data and displayed as vectors as shown by arrows 72 in FIG. 9. The magnetic field and magnetic flux density vector calculation unit 62 determines whether calculation of the magnetic field vector or magnetic flux density vector is executed until the count k reaches a final value k_end (S20). When the count k does not yet reach the final value k_end, the magnetic field and magnetic flux density vector calculation unit 62 increments the count k (S22) and returns the processing to step S12.

Meanwhile, when the calculation of the magnetic field vector or the magnetic flux density vector is executed until the count k reaches the final value k_end in step S20, then the magnetic field and magnetic flux density vector calculation unit 62 transmits the generated magnetic field and the magnetic flux density vector data obtained in the flow of FIG. 10 to the display control unit 64.

Note that the "generated" magnetic field vector or "generated" flux density vector refers to a magnetic field vector or a magnetic flux density vector that is measured at each sampling point, i.e., generated in each of the segments 70 (see FIG. 9). These terms are deliberately used to show a difference from the propagation intensity indicating the intensity of the magnetic field vector or the magnitude of the magnetic flux density vector that propagates to the evaluation point as will be described later.

When a request to display the generated magnetic field and magnetic flux density distribution image is input from the input unit 36 (S24, S26), the display control unit 64 further displays on the display unit 38 the generated magnetic field and magnetic flux density distribution image shown in FIG. 9 (S28). In the image, the calculated magnetic field vector or magnetic flux density vector is displayed at each of the sampling points in the vehicle cabin 11, i.e., at the center point of each of the segments 70.

Since the values of the magnetic field vectors or the magnetic flux density vectors vary with time as shown in FIG. 6, the arrows 72 representing the magnetic field vectors or magnetic flux vectors grow and shrink as time passes in the image of FIG. 9. Therefore, for example, a display mode may be switched such that the maximum value of each magnetic field vector or magnetic flux density vector is fixed and displayed.

As described before, when displaying the generated magnetic field and magnetic flux density distribution image, the measurement target surface is divided into the segments 70. The segments 70 are each segmented with a sampling point as its center point. For example, when transmitting the generated magnetic field and magnetic flux density vector data to the display control unit 64, the magnetic field and magnetic flux density vector calculation unit 62 also transmits coordinate data on boundary lines between segments at the time when the measurement target surface is divided into the segments 70.

For example, when the sensor elements 50 are disposed on the sensor sheet 42 at equal intervals in the width direction and the length direction, each segment 70 constitutes a square region around the coordinates where the sensor element 50 is located. The segments 70 are all equal in size.

As described before, the sensor sheet 42 is laid along the uneven shape of the floor panel 12. Accordingly, the three-dimensional shapes and directions of the respective segments 70 (for example, a normal vector with respect to the segment surface) may be different. The three-dimensional shapes of the respective segments 70 can be obtained from the three-dimensional data (3D-CAD data) in the vehicle cabin.

Display of Propagation Intensity Distribution Image

Figure 11:
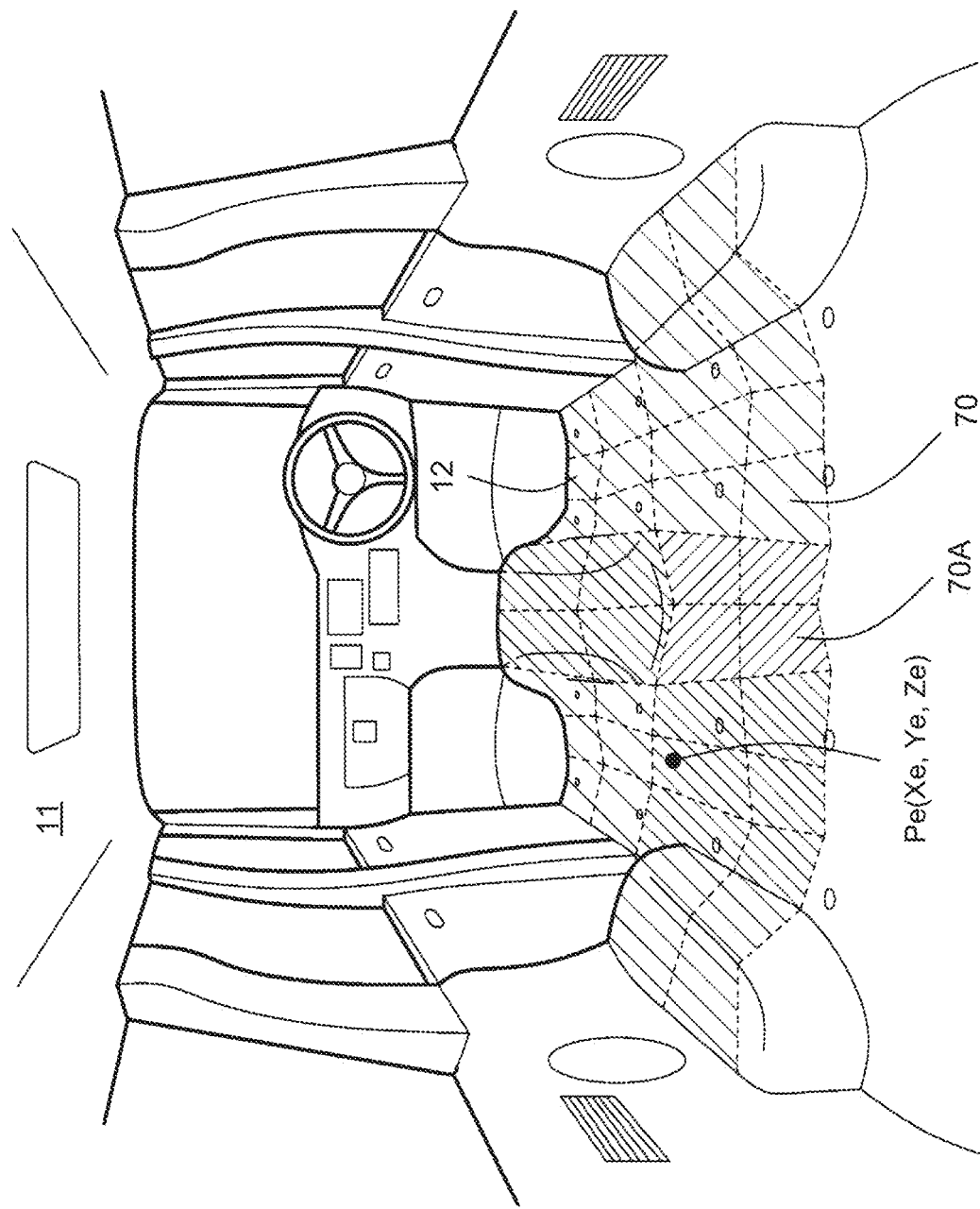
FIG. 11 illustrates a propagation intensity distribution image.

Referring to FIG. 7, the propagation intensity calculation unit 63 receives data on the generated magnetic field vector or generated magnetic flux density vector from the magnetic field and magnetic flux density vector calculation unit 62. Based on the data, the propagation intensity calculation unit 63 displays on the display unit 38 a propagation intensity image as illustrated in FIG. 11 through the display control unit 64.

In the propagation intensity image, the intensity of the magnetic field or the magnitude of the magnetic flux density that propagates to the evaluation point Pe that is separated from the measurement target surface (floor panel 12) is displayed for each of the segments 70 on the measurement target surface. For example, the intensity of the magnetic field or the magnitude of the magnetic flux density (propagation intensity) propagating from a certain segment 70A to the evaluation point Pe is expressed by sparse or dense of hatching on the segment 70A. In the example shown in FIG. 11, as the hatching is denser, the propagation intensity becomes relatively higher.

Qualitatively, the propagation intensity has two characteristics: (1) the propagation intensity is higher as the magnetic field is closer to the evaluation point Pe; and (2) the propagation intensity is higher as the magnetic field vector or magnetic flux density vector orients more to the evaluation point Pe. As the propagation intensity, a contribution degree of the magnetic field to the evaluation point Pe is shown in each segment on the measurement target surface. For example, by applying a shielding member to the segment 70 (a dense hatching segment) with a relatively high propagation intensity based on the image, it becomes possible to predict that the intensity of propagation to the evaluation point Pe can be effectively reduced.

Figure 12:
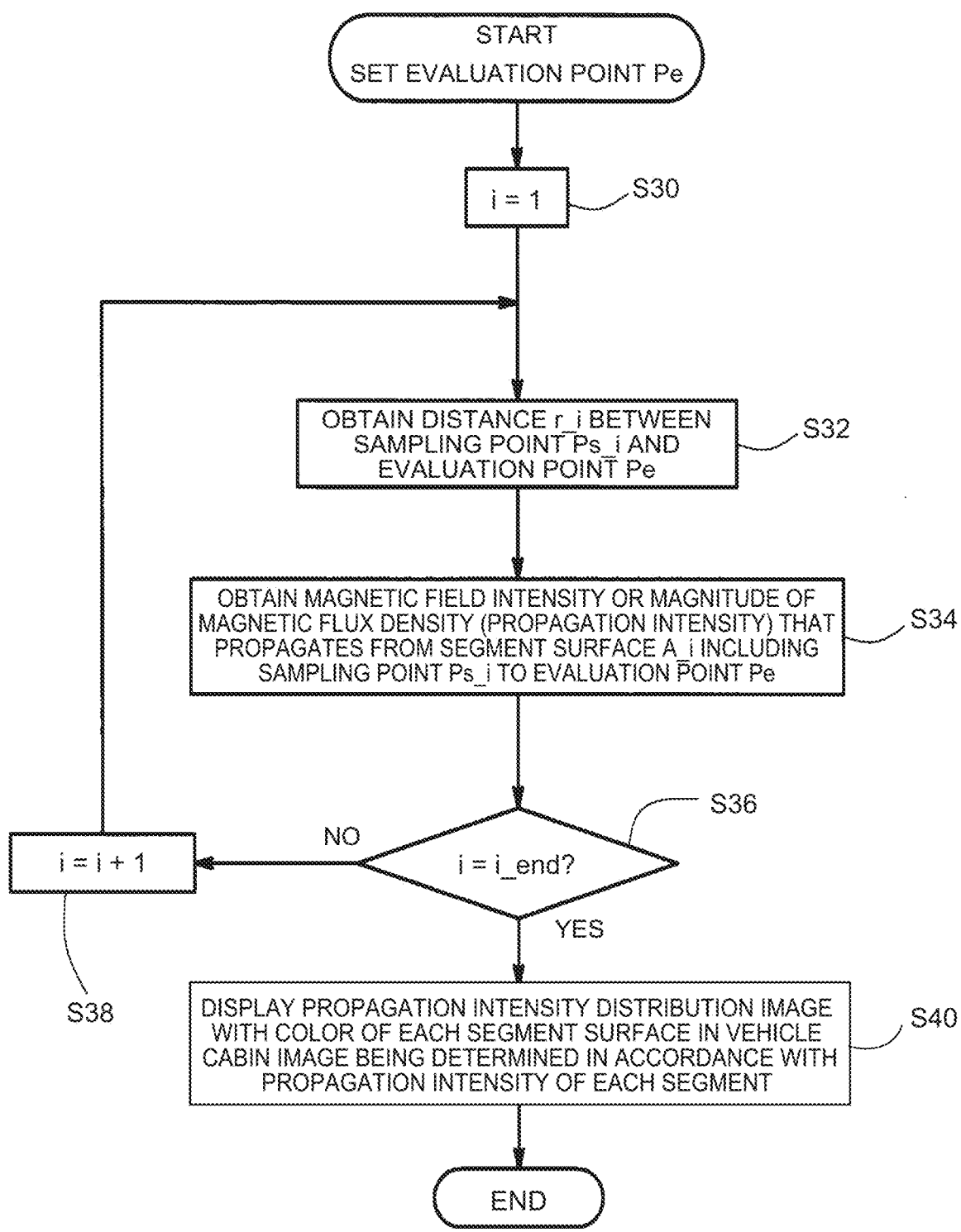
FIG. 12 illustrates a display flow of the propagation intensity distribution image.
Figure 13:
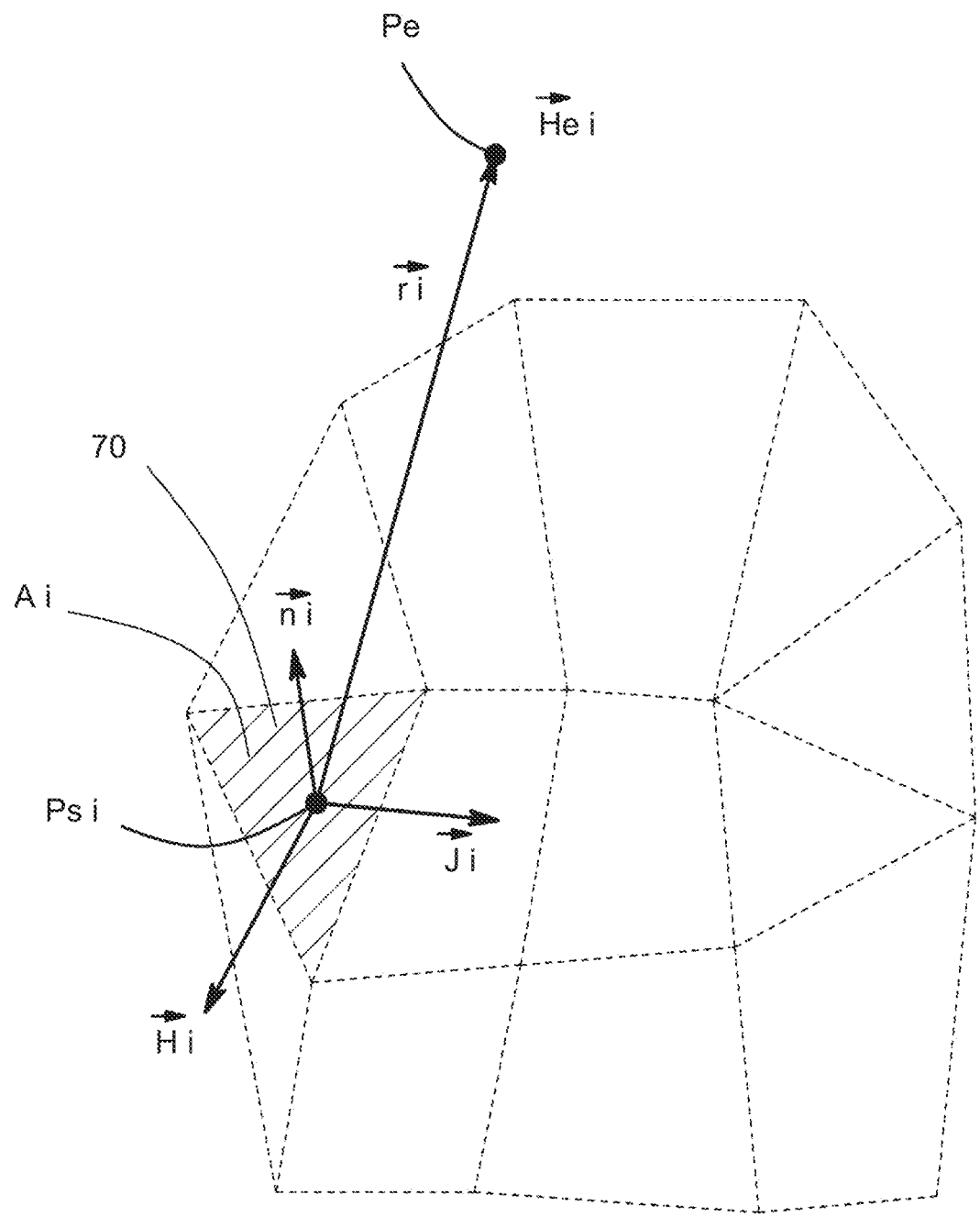
FIG. 13 is an explanatory view of a calculation method of the propagation intensity.

FIG. 12 illustrates a display flow of the propagation intensity distribution image. FIG. 13 shows examples of various parameters for calculating the propagation intensity. A vector $He_i$ represents a magnetic field vector that propagates from the segment 70 to the evaluation point Pe. The magnitude of the vector $He_i$ is the propagation intensity. The main processing in the flow shown in FIG. 12 is to obtain the magnetic field vector $He_i$. It is also possible to use the magnetic permeability $\mu$ to obtain a magnetic flux density vector $Be_i$ ($Be_i=\mu He_i$) instead of the magnetic field vector $He_i$.

In the case of obtaining the magnetic field vector $He_i$ that propagates from each of the segments 70 to the evaluation point Pe, the magnetic field vector $H_i$ (or magnetic flux density vector $B_i$) generated from each of the segments 70 and measured by the magnetic field measurement device 40 and a separation distance $r_i$ between each of the segments 70 and the evaluation point Pe are used.

Referring to FIG. 13, the vector $r_i$ represents the separation distance from a sampling point $Ps_i$ to the evaluation point Pe. When the area of the segments 70 is sufficiently small, the vector $r_i$ represents the separation distance between each point of the segments 70 and the evaluation point Pe. A vector $n_i$ represents a normal vector of the segment 70. An area $A_i$ indicates the area of the segment 70. The magnetic field vector $H_i$ represents the magnetic field vector generated from the sampling point $Ps_i$, i.e., the magnetic field vector measured by the magnetic field measurement device 40. As described before, since the magnetic field is an alternating field and varies with time, a maximum value in a prescribed period (for example, in five periods) is used as a representative value. It is also possible to use a magnetic flux density vector $B_i$ instead of the magnetic field vector $H_i$ by using the magnetic permeability $\mu$.

Referring to FIGS. 7 and 12, any point on the three-dimensional data in the vehicle cabin is selected as the evaluation point Pe through the input unit 36. For example, as shown in FIG. 1, the evaluation point Pe on top of the seat cushion of a rear seat 18 is selected. The selection may be made by, for example, inputting the three-dimensional coordinates in the vehicle cabin, or by specifying a point in the three-dimensional image in the vehicle cabin (for example, 3D-CAD data).

Upon reception of the selection of the evaluation point Pe, the propagation intensity calculation unit 63 sets the segment count i to an initial value "1" (S30). The propagation intensity calculation unit 63 further obtains a distance $r_i$ between the sampling point $Ps_i$ and the evaluation point Pe (S32). In FIG. 12, the sampling points or vectors are suffixed by an under-bar followed by a symbol.

The propagation intensity calculation unit 63 obtains the magnetic field intensity or the magnitude of magnetic flux density that propagates from a segment surface $A_i$ including the sampling point $Ps_i$ to the evaluation point Pe, i.e. the propagation intensity (S34). For example, the propagation intensity is calculated as follows:

Expression (1) below shows Ampere's law.

[Expression 1]

$$\nabla \times \vec{H} - \delta \vec{D}/\delta t = \vec{I} \text{ where} \quad (1)$$

$\vec{H}$: magnetic field vector $\vec{D}$: electron flux density vector $\left(\vec{D} = \varepsilon \vec{E}, \varepsilon \text{ are dielectric}\right)$ factors $\vec{I}$: current density vector Here, it is known that the magnetic fields that propagate from the electric devices mounted on the vehicle to the inside of the vehicle cabin are in a low frequency band as described before. It is known that the contribution of the term of an electron flux density vector that is the second term on the left side is small in the magnetic fields in the low-frequency band. It is also known that on boundaries of the segments, a nabla operator $\nabla \times$ is a normal vector $n \times$. Based on these factors, Expression (2) is derived.

[Expression 2]

$$\vec{I}_i = \vec{n}_i \times \vec{H}_i \text{ where} \quad (2)$$

$\vec{H} = (H_{ix}, H_{iy}, H_{iz})$: magnetic field vector $\vec{n}_i = (n_{ix}, n_{iy}, n_{iz})$: segment normal vector $\vec{I}_i = (I_{ix}, I_{iy}, I_{iz})$: current density vector In Expression (2), the normal vector $n_i$ can be obtained from the surface shape of the segment 70. The magnetic field vector $H_i$ is also obtained by the magnetic field and magnetic flux density vector calculation unit 62. Therefore, a current density vector can be calculated based on Expression (2).

Next, a magnetic field intensity dH at a point P, distanced by a separation distance r from a microscopic portion ds of a conductor through which current I flows, can be calculated from Expression (3) below:

[Expression 3]

$$d\vec{H} = \frac{Id\vec{s}}{4\pi r^2} \times \frac{\vec{r}}{r} \quad (3)$$

When Expression (3) is divided by the area of the segment 70, the following expression (4) is obtained:

[Expression 4]

$$\vec{H}_{ei} = \frac{\vec{I}_i \times \vec{r}_i}{4\pi|\vec{r}_i|^3} A_i \text{ where} \quad (4)$$

$\vec{H}_{ei}$: magnetic field vector propagating from segment to evaluation point $Pe$ $\vec{r}_i$: distance vector between evaluation point and segment center (sampling point)

$A_i$: area of segment

As for the right term in Expression (4), the current density vector is obtained from Expression (2). The separation distance vector $r_i$ and the area $A_i$ can be obtained from the three-dimensional data in the vehicle cabin. The magnetic field vector $He_i$ obtained by Expression (4), or the magnitude of the magnetic flux density vector $Be_i$ calculated by multiplying the magnetic field vector $He_i$ by permeability is the propagation intensity.

Referring to FIG. 12, the propagation intensity calculation unit 63 determines whether or not a segment count i of the segments 70 subjected to calculation of the propagation intensity is a final value i_end (S36). When the segment count i does not yet reach the final value i_end, the propagation intensity calculation unit 63 increments the segment count i (S38) and returns the processing to step S32.

Meanwhile, when the segment count i reaches the final value i_end in step S36, the propagation intensity calculation unit 63 transmits propagation intensity distribution image data to the display control unit 64. For the propagation intensity distribution image, the color or hatching of each segment in the vehicle cabin image is determined in accordance with the propagation intensity of each segment. In the case of displaying values of the propagation intensity, highlighting may be performed, such as relatively large values being displayed in large fonts. When a request to display the propagation intensity distribution image is input through the input unit 36, the display control unit 64 displays on the display unit 38 the propagation intensity distribution image (see FIG. 11) (S40).

Display of Contribution Degree Graph

Since the propagation intensity distribution image can be obtained, it is possible to narrow down the regions where the magnetic field or magnetic flux density that propagates to the evaluation point Pe can be reduced. As one of the narrowing down functions, a function allowing selection of a plurality of segments and calculating the ratio of a contribution degree, that is, the ratio of the propagation intensity in the selected regions to the propagation intensity of the entire measurement target region, is included in the magnetic field evaluation device 30.

Figure 14:
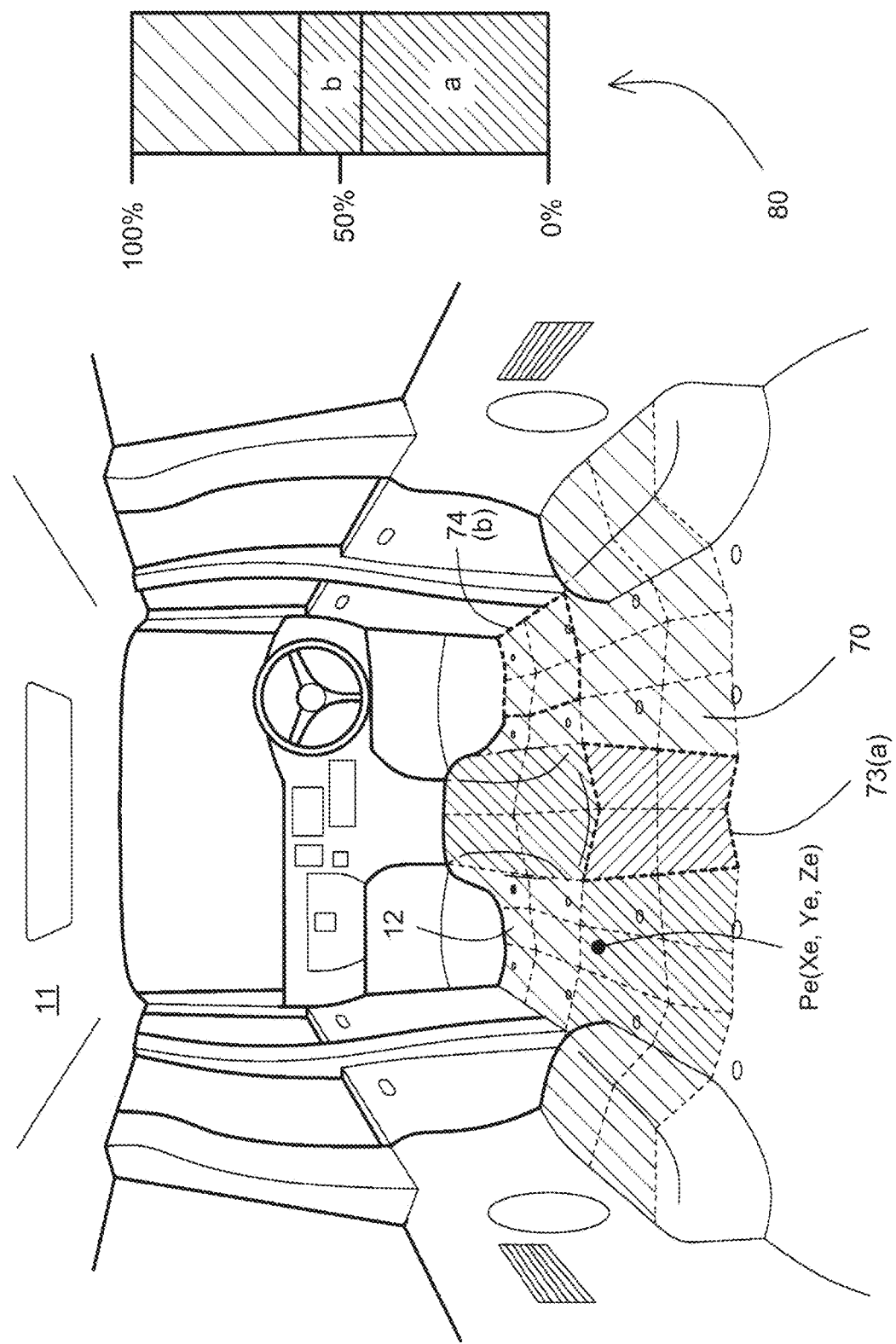
FIG. 14 shows an example of displaying a contribution degree of the propagation intensity in a selected segment group.
Figure 15:
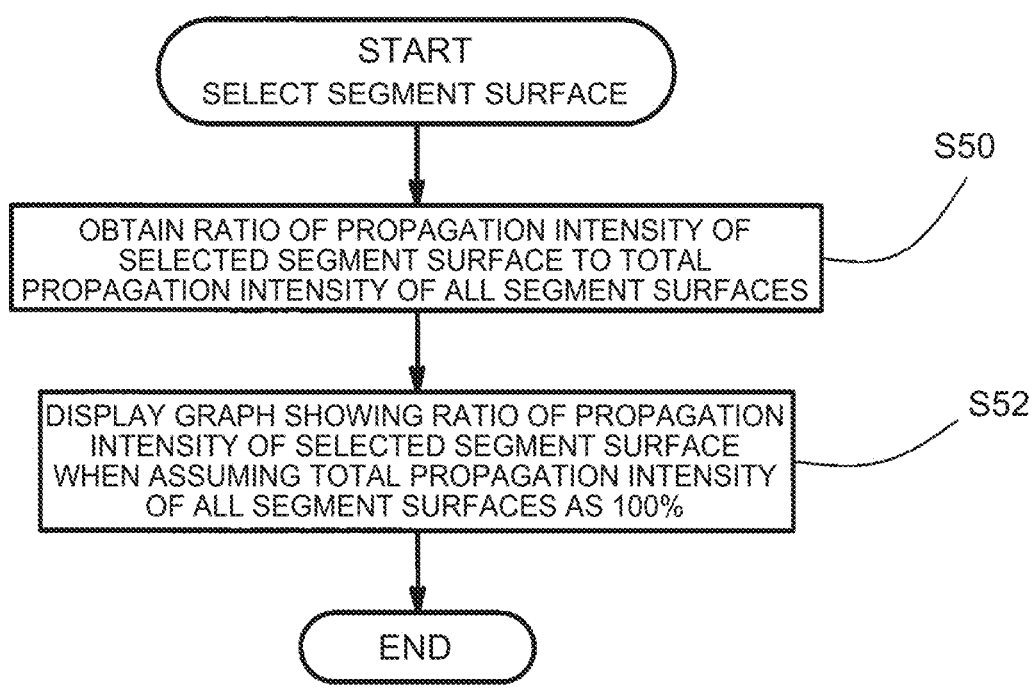
FIG. 15 shows a flow of displaying the contribution degree of the propagation intensity in the selected segment group.

Referring to FIGS. 7, 14 and 15, the segments 70 are selected through operation of the input unit 36. In FIG. 14, the selected segments are encircled by a thick dashed line. The selection of the segment group can be performed by dividing the segments into a plurality of segment groups. For example, in FIG. 14, a segment group "a" shown as a selection range 73 and a segment group "b" shown as a selection range 74 are illustrated.

After the selection operation, the propagation intensity calculation unit 63 obtains the ratio of the propagation intensity of the selected segment group to total propagation intensity of all the segments 70 (FIG. 15, S50). For example, the propagation intensity calculation unit 63 displays, in the form of a band graph 80 as shown in FIG. 14, the ratio of the propagation intensity of the segment groups "a", "b" when it assumes the total propagation intensity of all the segment surfaces as 100% (S52).

For example, when a target reduction ratio of the magnetic field that propagates to the evaluation point Pe is predetermined, selecting the segment group as described above makes it possible to identify a shielding measure target region in order to reach the target reduction ratio.

Thus, the magnetic field evaluation system according to the present embodiment can identify sources of magnetic field propagation or magnetic flux density propagation to the evaluation point Pe. In addition, it also becomes possible to identify the propagation intensity of the magnetic field or magnetic flux density that propagates from each propagation source to the evaluation point.

Another Example of Magnetic Field Evaluation System

In the embodiment disclosed, the magnetic field measurement device 40 includes the sensor sheet 42 that allows simultaneous measurement at a plurality of points. However, the present disclosure is not limited to the embodiment. For example, a magnetic field measurement device 140 having only one sensor element 50 can be used to measure the magnetic field while moving on the floor panel 12 as shown in FIG. 16.

Figure 16:
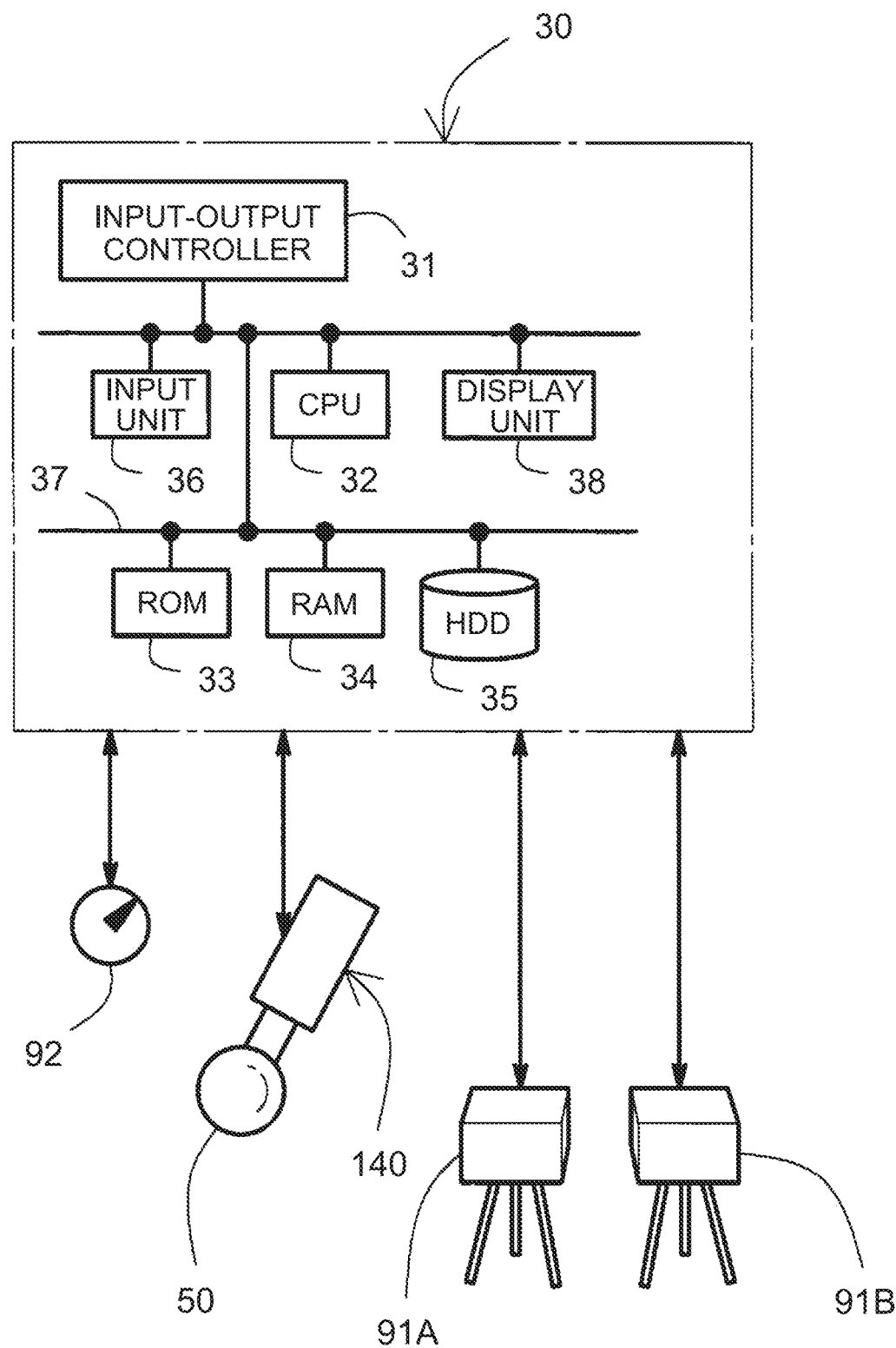
FIG. 16 illustrates hardware configuration of the magnetic field evaluation system for a vehicle according to another example (movable measurement) of the present embodiment.

FIG. 16 illustrates the hardware configuration of the magnetic field evaluation system according to another example of the present embodiment. The hardware configuration is different from the hardware configuration in FIG. 3 in that the magnetic field evaluation device 30 is connected to devices including the magnetic field measurement device 140, two cameras 91A, 91B, and a reference signal output device 92.

Figure 17:
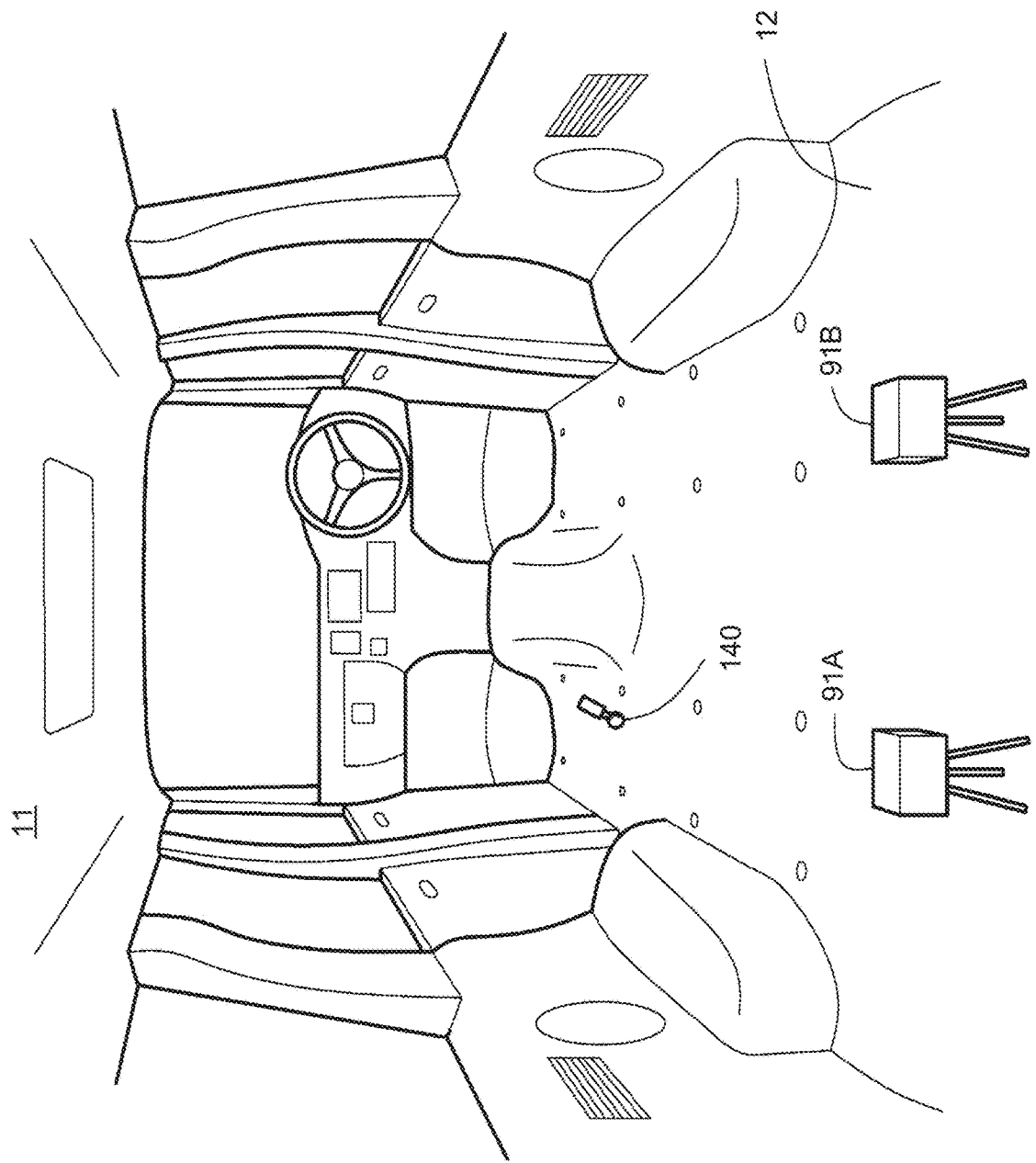
FIG. 17 is a perspective view showing an example of arranging the magnetic field measurement device and a stereo camera in the vehicle cabin.

The magnetic field measurement device 140 has only one sensor element 50. As shown in FIG. 17, multi-point measurement is made by the magnetic field measurement device 140 moving on the floor panel 12 that is an evaluation target surface. In other words, measurement of the magnetic field vector or magnetic flux density vector in each segment on the evaluation target surface is performed with a time lag. For example, multi-point measurement becomes possible by an operator carrying the magnetic field measurement device 140 and moving around the vehicle cabin 11. The magnetic field measurement device 140 also incorporates the detector 44 and the alternating current power source 46 illustrated in FIG. 3. Two or more magnetic field measurement devices 140 may be introduced into the vehicle cabin 11 within the range of spatial resolution provided by the cameras 91A, 91B.

The cameras 91A, 91B constitute a stereo camera used to identify the three-dimensional position of the magnetic field measurement device 140 in the vehicle cabin. For example, referring to FIG. 17, the cameras 91A, 91B are arranged at positions where the entire evaluation target surface is within the field of view. Since the method for identifying the three-dimensional position by the stereo camera is known, the description thereof is omitted here.

The reference signal output device 92 outputs a reference signal of a fixed frequency during a measurement period of the magnetic field vector or the magnetic flux density vector by the magnetic field measurement device 140. For example, a reference signal is continuously output from the time of measuring the first sampling point to the time of measuring the last sampling point on the measurement target surface. As will be described later, the reference signal is used as a reference signal that matches the waveform phases of the magnetic field and magnetic flux density waveforms at the respective sampling points. Note that the reference signal output device 92 may be incorporated into the magnetic field evaluation device 30.

Figure 18:
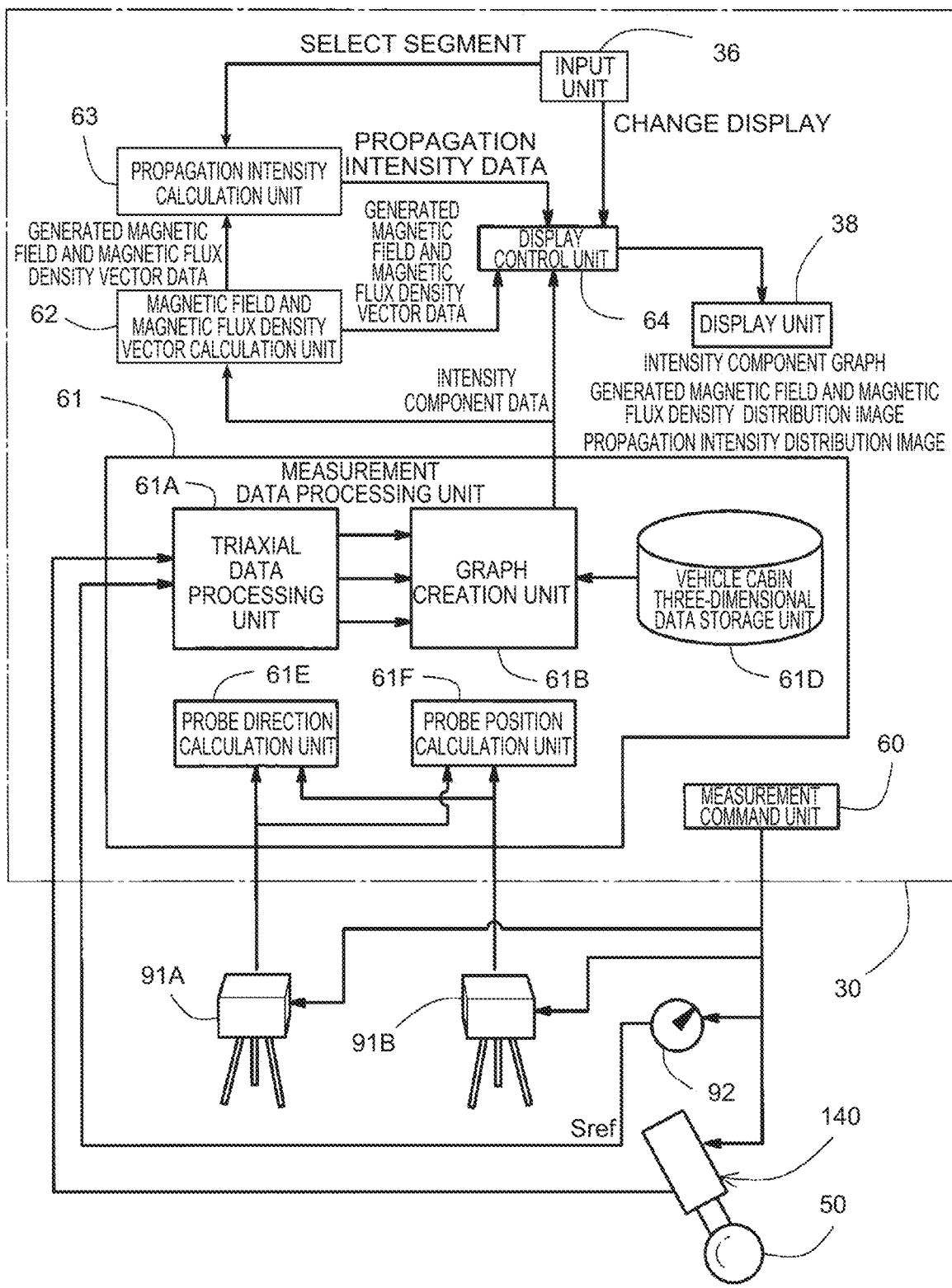
FIG. 18 illustrates functional blocks of the magnetic field evaluation system for a vehicle according to the other example (movable measurement) of the present embodiment.

FIG. 18 illustrates a functional block diagram of the magnetic field evaluation system shown in FIG. 16. As in the case of FIG. 7, the functional block diagram is configured by the CPU 32 executing the magnetic field evaluation program stored in the ROM 33 (see FIG. 3) or the hard disk drive 35, or a non-transitory computer-readable storage medium such as a DVD.

The functional block diagram shown in FIG. 18 is different from the functional block diagram of FIG. 7 in the point that the triaxial correction data storage unit 61C is omitted. The functional block diagram shown in FIG. 18 is also different in the point that a probe direction calculation unit 61E and a probe position calculation unit 61F are added to the magnetic field evaluation device 30.

The probe position calculation unit 61F obtains the coordinates (x,y,z) of the sensor element 50 in the vehicle cabin space based on the position of the sensor element 50 photographed by the cameras 91A, 91B. The probe direction calculation unit 61E identifies the directions of orthogonal three axes (Xs, Ys, Zs in FIG. 8) in which the sensor element 50 measures the magnetic field or magnetic flux density based on the positions and directions of the magnetic field measurement device 140 and the sensor element 50 imaged by the cameras 91A, 91B. The amount of deviation between the identified directions of the three axes and the directions of three axes of the reference space coordinate system is corrected by the triaxial data processing unit 61A, and the magnetic field or the magnitude of the magnetic flux density measured by the sensor element 50 is converted into triaxial component of the reference coordinate system and displayed on the display unit 38.

Figure 19:
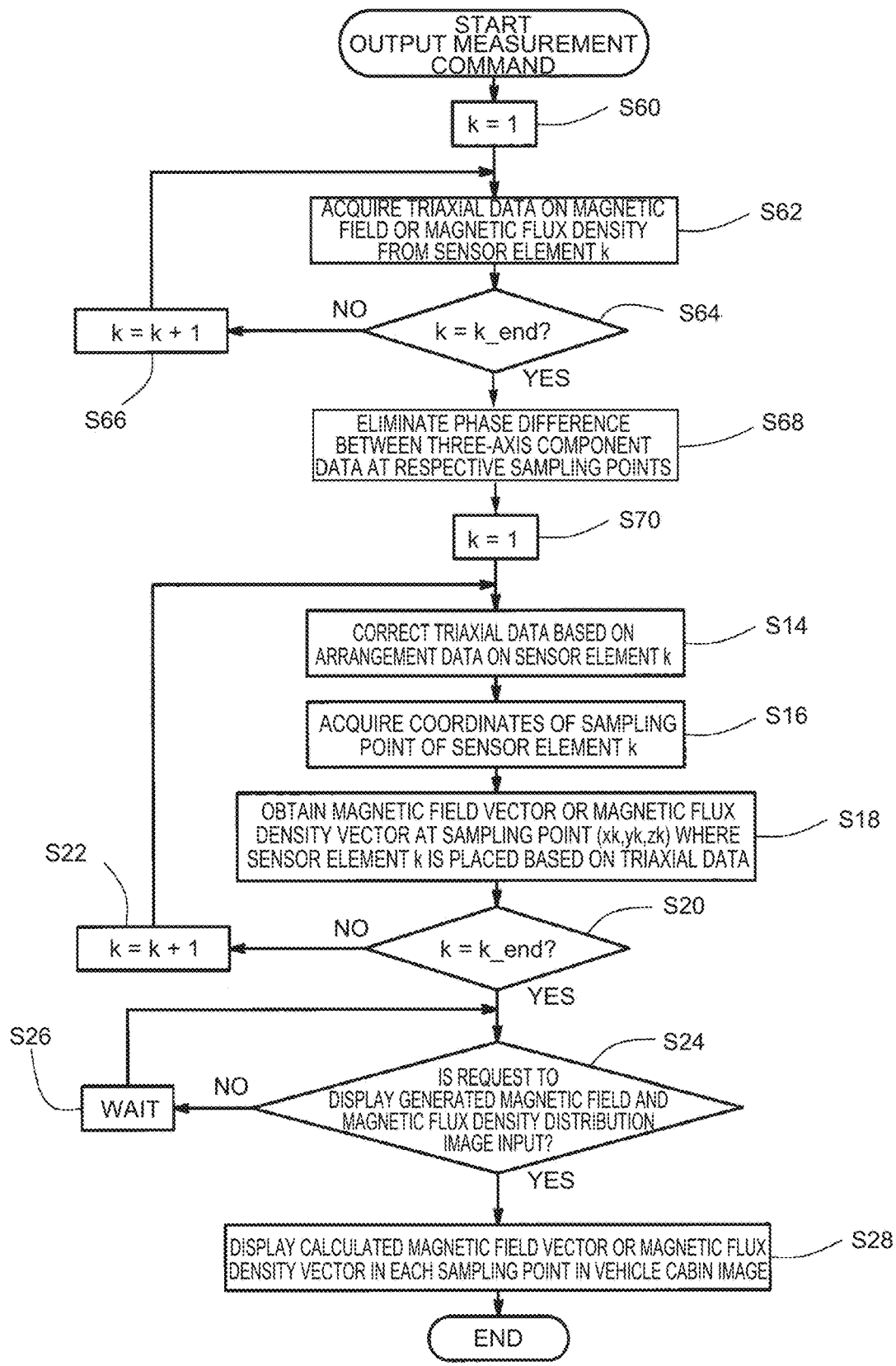
FIG. 19 illustrates a display flow of a generated magnetic field and magnetic flux density distribution image in the magnetic field evaluation system for a vehicle according to the other example (movable measurement) of the present embodiment.

FIG. 19 illustrates a processing flow of magnetic field or magnetic flux density data measured by the magnetic field measurement device 140. The flow in FIG. 19 partially includes the steps same as the steps in the flow in FIG. 10. Since the same steps have already been described, the description thereof is omitted as appropriate in the following.

When a measurement command is input through the input unit 36, the measurement command unit 60 transmits the measurement command to the magnetic field measurement device 140. Here, an operator carrying the magnetic field measurement device 140 may operate the input unit 36.

The triaxial data processing unit 61A sets the counter k to an initial value "1" (S60), and acquires triaxial component data on the magnetic field or magnetic flux density measured by the sensor element 50 (S62). Next, the triaxial data processing unit 61A determines whether or not the number of pieces of the acquired triaxial component data has reached a predetermined number of the sampling points. For example, the triaxial data processing unit 61A determines whether or not the counter k reaches the final value k_end (S64). When the count k does not yet reach the final value k_end, the counter k is incremented (S66) and the processing is returned to step S62.

Meanwhile, when the counter k reaches the final value k_end in step S64, the triaxial data processing unit 61A eliminates the phase difference between the pieces of the triaxial component data on the magnetic field vector or magnetic flux density vector at the respective sampling points (i.e., respective segments 70) (S68). For example, referring to FIG. 20, the triaxial data processing unit 61A receives a reference signal ref in addition to the triaxial component data. Based on the reference signal ref, the triaxial data processing unit 61A obtains, for example, phase difference $\Delta\varphi$ between the triaxial component data at a sampling point (x1,y1,z1) and the triaxial component data at a sampling point (x2,y1,z1). By staggering one of the two triaxial component data by $\Delta\varphi$, the time points of extreme values of the respective reference signals ref are matched, for example, and therefore the phases of both pieces of the data are matched.

Referring to FIG. 19, when the phase difference between the pieces of the triaxial component data at the respective sampling points (or the respective segments) is eliminated by the triaxial data processing unit 61A in step S68, the counter k is again set to the initial value "1" (S70), and the steps similar to those in FIG. 10 are executed. As a result, the display control unit 64 makes it possible to display the generated magnetic field and magnetic flux density distribution image shown in FIG. 9.

As described in the foregoing, in the distribution image in FIG. 9, each magnetic field vector or magnetic flux density vector changes in time. When the vectors change in time, eliminating the phase difference between the vectors makes it possible to display the time change similar to the time change in the case of the simultaneous measurement at a plurality of points.

What is claimed is:

1. A magnetic field evaluation system for a vehicle, comprising:
    a magnetic field measurement device configured to measure a magnetic flux density vector or a magnetic field vector generated from each of a plurality of segments obtained by segmenting a measurement target surface that is any plane surface of a vehicle; and
    a magnetic field evaluation device connected to the magnetic field measurement device, wherein
    the magnetic field evaluation device includes
    a propagation intensity calculation unit configured to calculate propagation intensity that is intensity of a magnetic field or a magnitude of magnetic flux density that propagates from each of the segments to an evaluation point that is separated from the measurement target surface with use of the magnetic flux density vector or the magnetic field vector in each of the segments and a separation distance between the segments and the evaluation point, and a display control unit configured to display on a display unit a propagation intensity distribution image indicating a position of the evaluation point and distribution of the propagation intensity in each of the segments.

2. The magnetic field evaluation system according to claim 1, wherein:
    the magnetic field measurement device measures the magnetic flux density vector or the magnetic field vector in each of the segments with a time lag;

the magnetic field evaluation device is connected to a reference signal output device that outputs a reference signal of a fixed frequency during a measurement period of the magnetic flux density vector or the magnetic field vector by the magnetic field measurement device; and the magnetic field evaluation device further includes a data processing unit that calculates phase difference between the magnetic flux density vectors or the magnetic field vectors of different segments among the segments based on the reference signal.

3. The magnetic field evaluation system according to claim 2, wherein:

the measurement target surface is a vehicle cabin panel surrounding a vehicle cabin; and the evaluation point is set in a portion of the vehicle cabin that is separated from the vehicle cabin panel.

4. A magnetic field evaluation program for a vehicle causing a computer, used in unison with a magnetic field measurement device that measures a magnetic flux density vector or a magnetic field vector generated from each of a plurality of segments obtained by segmenting a measurement target surface that is any plane surface of a vehicle, to function as:

a propagation intensity calculation unit configured to calculate propagation intensity that is intensity of a magnetic field or a magnitude of magnetic flux density that propagates from each of the segments to an evaluation point that is separated from the measurement target surface with use of the magnetic flux density vector or the magnetic field vector in each of the segments and a separation distance between the segments and the evaluation point; and a display control unit configured to display on a display unit a propagation intensity distribution image indicating a position of the evaluation point and distribution of the propagation intensity in each of the segments.

* * * * *